United States Patent [19]
Kanno et al.

[11] Patent Number: 5,671,164
[45] Date of Patent: Sep. 23, 1997

[54] SIGNAL MEASUREMENT METHOD AND SIGNAL MEASUREMENT APPARATUS

[75] Inventors: Masayoshi Kanno; Mariko Okumura, both of Tokyo, Japan

[73] Assignee: Sony Corporation, Tokyo, Japan

[21] Appl. No.: 702,990

[22] Filed: Aug. 26, 1996

[30]     Foreign Application Priority Data

Aug. 29, 1995   [JP]   Japan .................................. 7-220578

[51] Int. Cl.$^6$ ...................................... G01R 23/16
[52] U.S. Cl. ................................ 364/569; 364/487
[58] Field of Search ............................ 364/569, 481, 364/486, 487; 324/76.12, 76.52, 76.55, 76.77, 76.82, 86, 99 D, 102, 107

[56]            References Cited

U.S. PATENT DOCUMENTS

| | | | |
|---|---|---|---|
| 4,608,652 | 8/1986 | Yokokawa et al. | 364/481 |
| 4,644,268 | 2/1987 | Malka et al. | 324/83 R |
| 4,807,165 | 2/1989 | Becker | 364/569 |
| 4,818,931 | 4/1989 | Naegeli et al. | 324/77 B |
| 5,235,270 | 8/1993 | Shimada et al. | 324/121 R |
| 5,485,078 | 1/1996 | Liken et al. | 324/76.12 |

*Primary Examiner*—James P. Trammell
*Attorney, Agent, or Firm*—Limbach & Limbach L.L.P.

[57]             ABSTRACT

A signal measurement apparatus is provided which does not require a special pattern to measure and evaluate reproduced data of a digital signal. RF data, which is binary-coded data obtained by reproducing digital recorded signal, and latch data obtained by latching the RF data in response to a reproduction clock signal reproduced by using the RF data are supplied through a signal input terminal thereof and respectively supplied to a first-pattern-length detection section and a second-pattern-length detection section so that the pattern lengths of predetermined patterns are measured. Then, a 2D display section plots the first pattern lengths on the X axis and the second pattern lengths on the Y axis to 2D-display the first and second pattern lengths.

12 Claims, 21 Drawing Sheets

STRUCTURAL VIEW OF SIGNAL MEASUREMENT APPARATUS

STRUCTURAL VIEW OF SIGNAL
MEASUREMENT APPARATUS

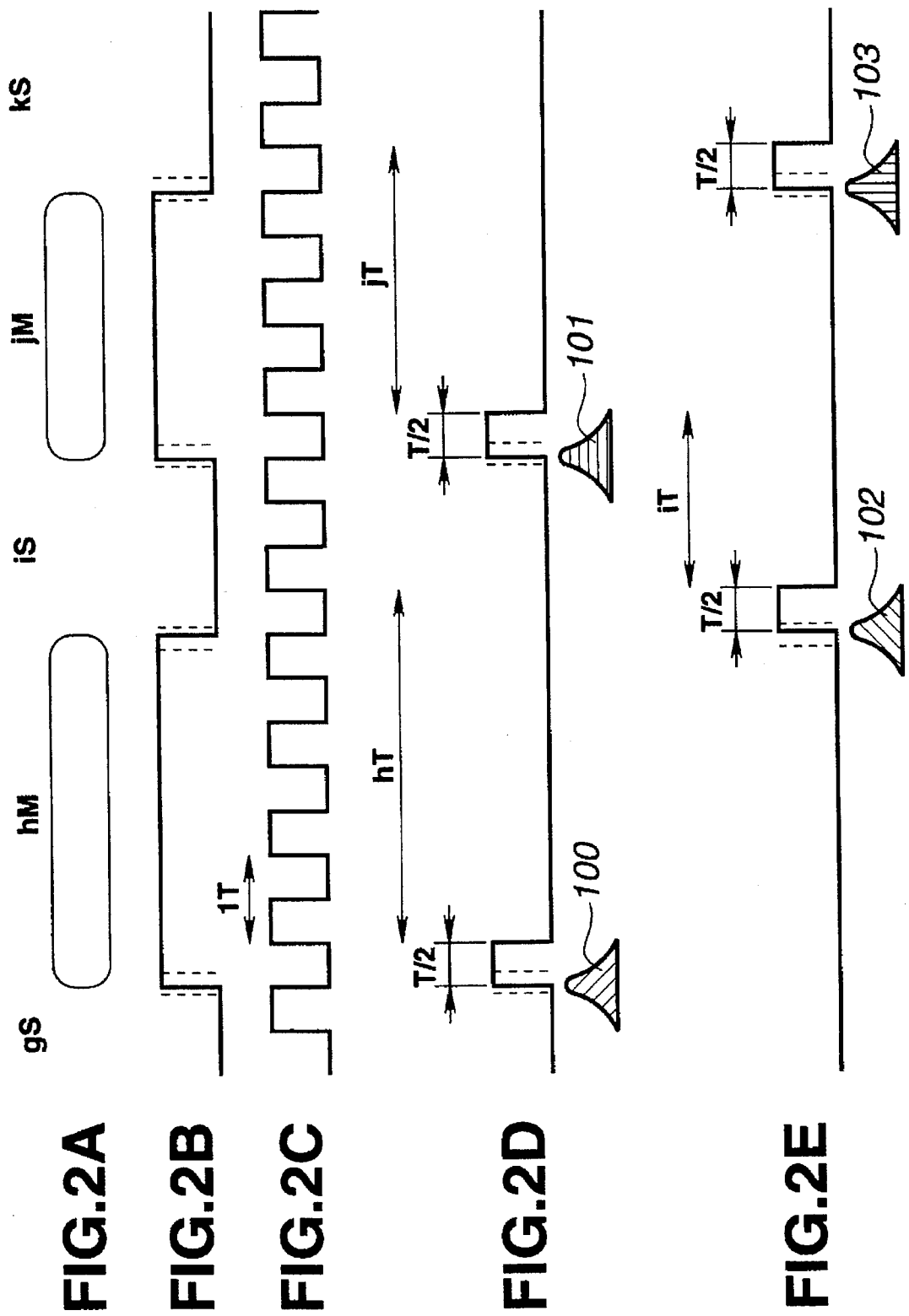

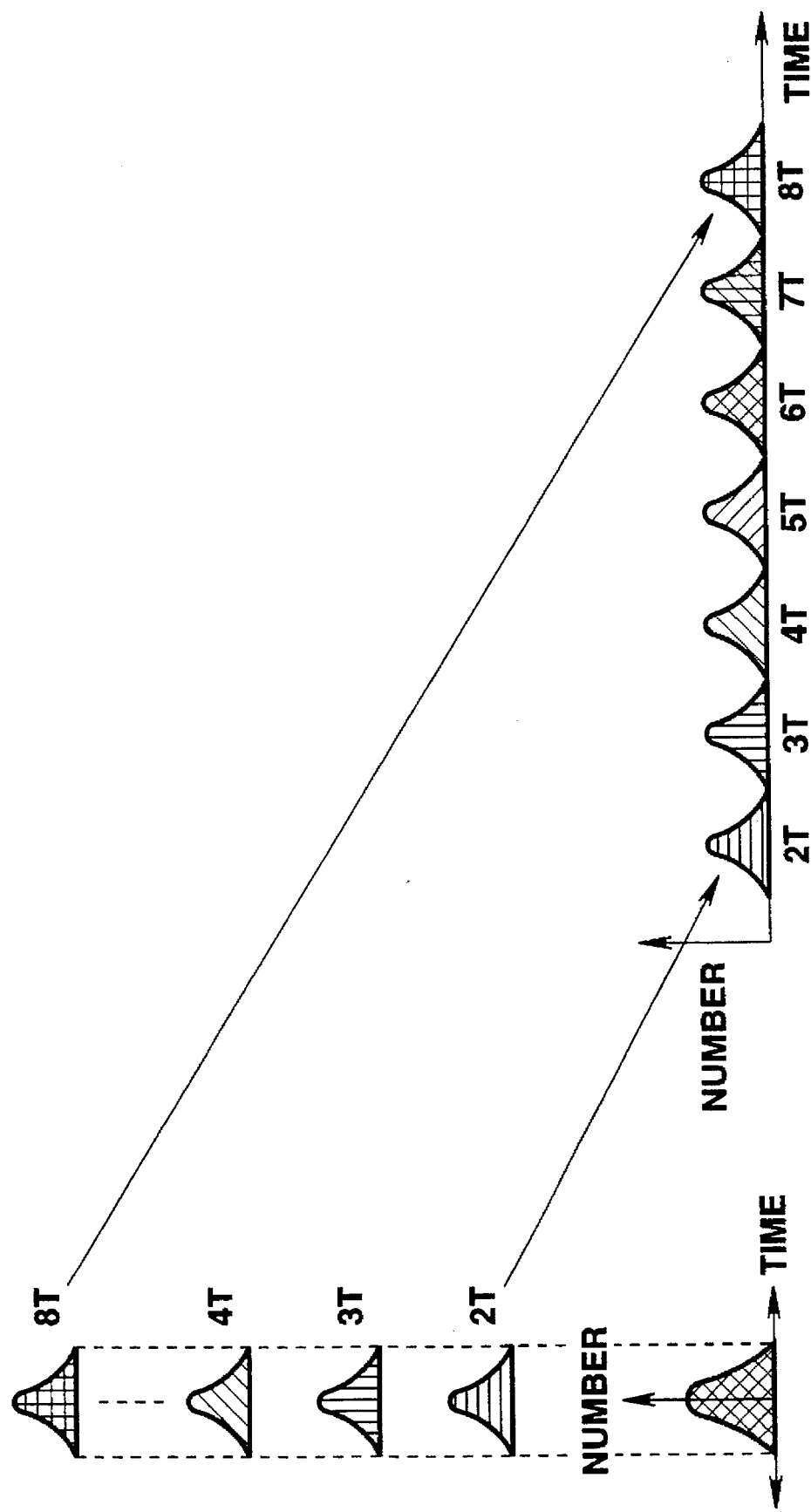

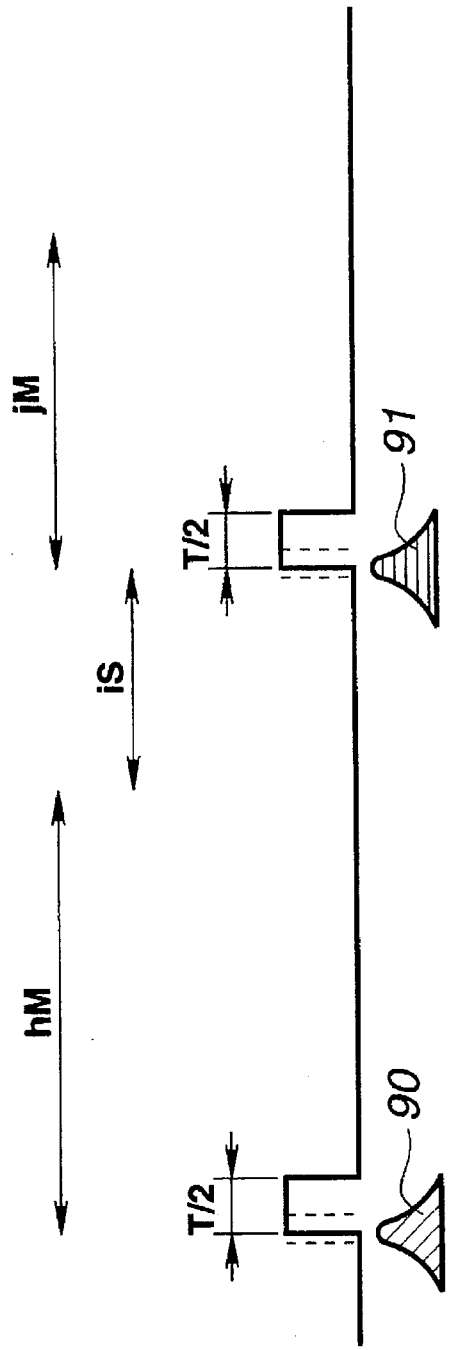

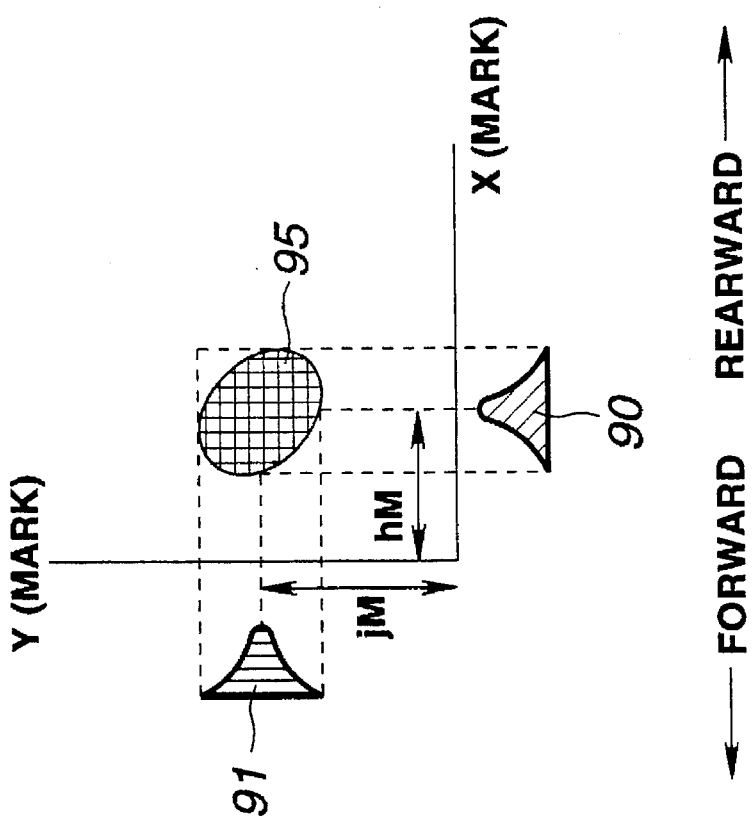
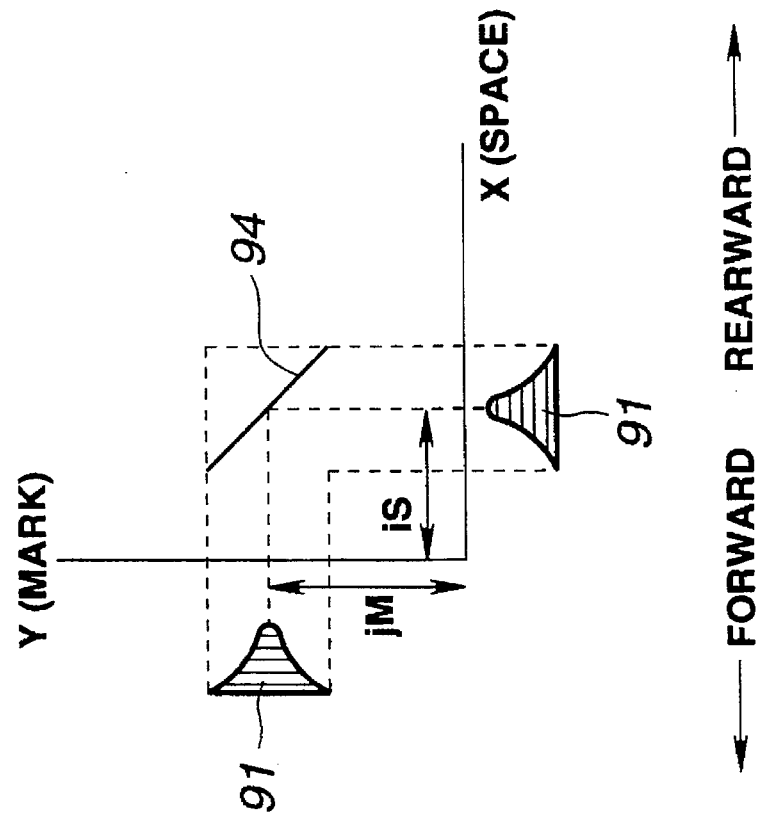
FIG.5B
FIG.5A

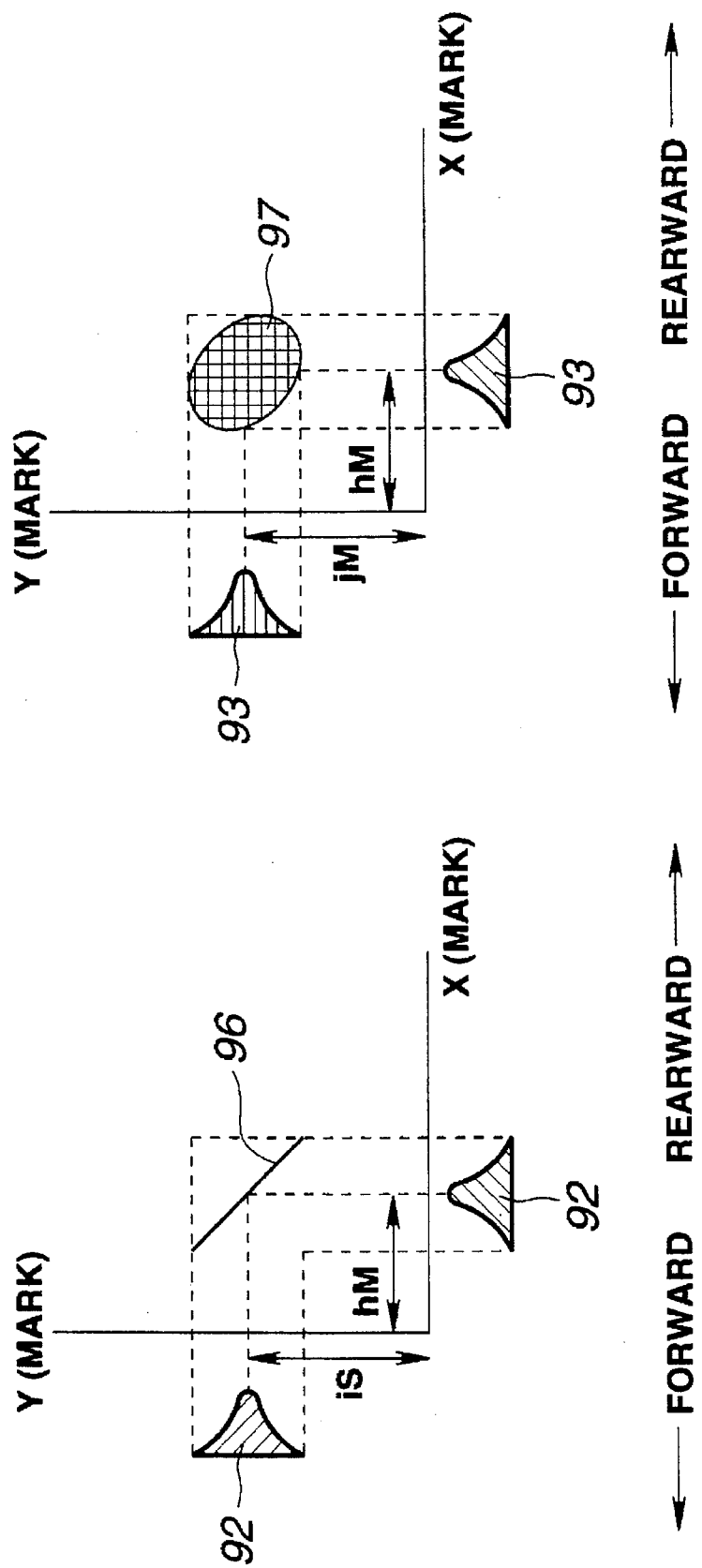

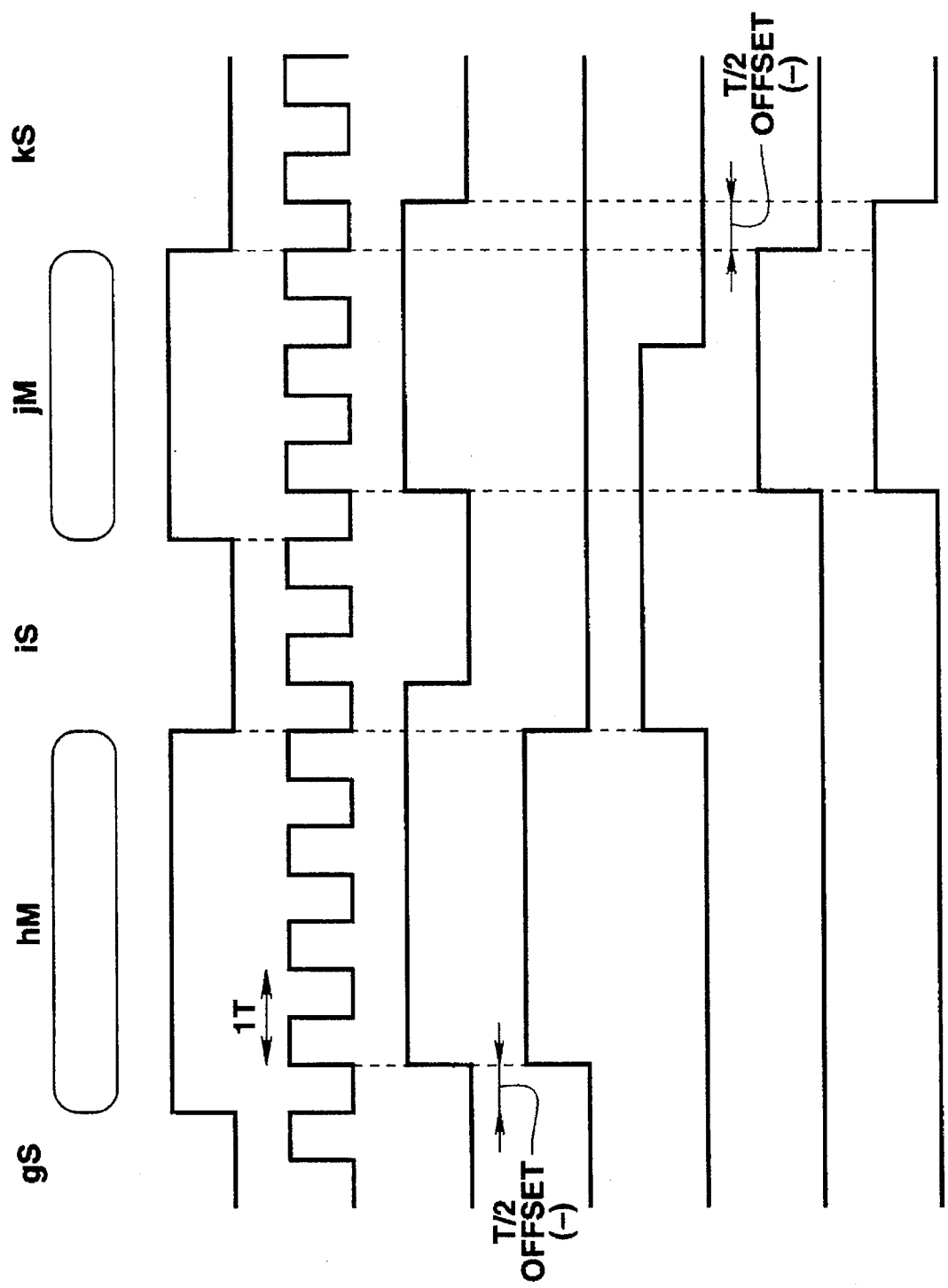

FIG.18A CLK
FIG.18B RFDT 
FIG.18C RCVDT
FIG.18D LTDT
FIG.18E DMLTH
FIG.18F DMODM
FIG.18G MLTH
FIG.18H MOM
FIG.18I REFM
FIG.18J MRST1
FIG.18K TVCNV1
FIG.18L MHLD1
FIG.18M M1
FIG.18N MRST2
FIG.18O TVCNV2
FIG.18P MHLD2
FIG.18Q M2
FIG.18R MHLD3
FIG.18S MRST3
FIG.18T MARK FIG. 19A CLK
FIG. 19B RFDT
FIG. 19D LTDT
FIG. 19E DSLTH
FIG. 19F DSODS
FIG. 19G SLTH
FIG. 19H SOS
FIG. 19I REFS
FIG. 19J SRST1
FIG. 19K TVCNV1
FIG. 19L SHLD1
FIG. 19M S1
FIG. 19N SRST2
FIG. 19O TVCNV2
FIG. 19P SHLD2
FIG. 19Q S2
FIG. 19R SHLD3
FIG. 19S SRST3
FIG. 19T SPACE
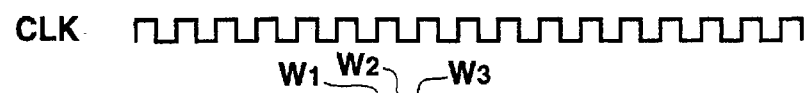
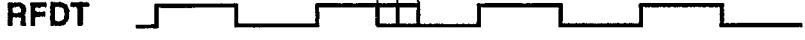
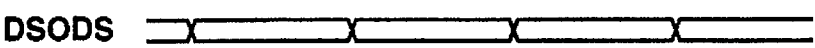
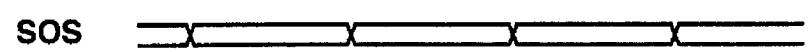
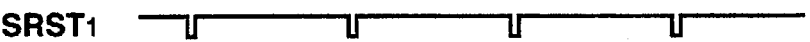
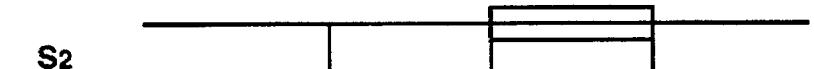

SIGNAL MEASUREMENT METHOD AND SIGNAL MEASUREMENT APPARATUS

BACKGROUND OF THE INVENTION

1. Field of the Invention

The present invention relates to a signal measurement method and a signal measurement apparatus for evaluating a digital signal.

2. Related Art

Hitherto, when data is reproduced from a recorded pattern of a digital signal recorded on a recording medium, the quality of the recorded signal, the margin of a signal reproducing apparatus and the like have generally been evaluated based on the phase difference between reproduced data and a clock.

Since the position and size of an actually recorded signal are different from those of an ideal signal, fluctuation takes place at the edges of RF data which is binary-coded data obtained by reproducing the recorded signal. The fluctuation at the edges of RF data is an AC component which is one of causes of the jitters. Note that a signal portion recorded on a disk-type recording medium is called a "mark".

An ideal phase of the edge of RF data exists at a point obtained by shifting by a half phase a reproduction clock signal generated by a PLL circuit by using RF data. However, the edge of the RF data is actually deviated from the ideal phase, that is, an edge shift takes place due to various reasons. The edge shift is a DC component.

The jitters are defined as the addition of the edge shift and the fluctuation.

In general, jitters are evaluated by statistically processing the phase difference between reproduced data and the clock, that is, the time difference between the same by using a timing interval analyzer. By detecting the phase difference between reproduced data and the clock, variation taking place due to change in the rotation and eccentricity has been removed.

In a case where signals are recorded on a recording medium by means of optical modulation, the amount of heat interference is different in each pattern so that the edge shift of RF data is also different in each pattern.

However, since the foregoing evaluation method identically treats phase information of edges of all patterns, there arises a problem that a special recording pattern for measurement is required when an evaluation is performed by detecting jitters with respect to a specific pattern or pattern dependency is evaluated.

Therefore, it is difficult to evaluate RF data which is actually reproduced.

What is worse, the differences in phase information of the edges cannot be separated for each pattern.

SUMMARY OF THE INVENTION

In view of the foregoing, an object of the present invention is to provide a signal measurement method and a signal measurement apparatus capable of evaluating any reproduced data if the data is reproduced data of a digital signal.

According to one aspect of the present invention, there is provided a signal measurement method including the steps of detecting a first pattern length which corresponds to an interval between first edges of digital binary-coded data; detecting a second pattern length which corresponds to an interval between second edges; and performing 2D display such that the first pattern length is made to be input to the X axis and the second pattern length is made to be input to the Y axis.

According to another aspect of the present invention, there is provided a signal measurement apparatus including first-pattern-length detection means for detecting a first pattern length which corresponds to an interval between first edges of digital binary-coded data; second-pattern-length detection means for detecting a second pattern length which corresponds to an interval between second edges; and 2D display means for performing 2D display such that the first pattern length is made to be input to the X axis and the second pattern length is made to be input to the Y axis.

Other objects, features and advantages of the invention will be evident from the following detailed description of the preferred embodiments described in the attached drawings.

BRIEF DESCRIPTION OF THE DRAWING

FIGS. 2A, 2B, 2C, 2D and 2E are graphs for explaining pulses indicating the phases of leading edges and tailing edges of a recorded signal;

FIGS. 3A and 3B are diagrams for explaining a conventional method of evaluating reproduced data of a digital signal;

FIGS. 4A and 4B are diagrams for explaining the amount of shift and fluctuation of the phase of a leading edge of a recorded signal;

FIGS. 5A and 5B are diagrams for explaining a method of evaluating a digital signal by using the amount of shift and fluctuation of the phase of the leading edge;

FIGS. 7A and 7B are diagrams for explaining a method of evaluating a digital signal by using the amount of shift and the fluctuation of the phase of the trailing edge;

FIGS. 15A, 15B, 15C, 15D, 15E, 15F, 15G and 15H are timing charts of signals in the signal measurement apparatus shown in FIG. 14;

FIGS. 18A, 18B, 18C, 18D, 18E, 18F, 18G, 18H, 18I, 18J, 18K, 18L, 18M, 18N, 18O, 18P, 18Q, 18R, 18S and 18T are timing charts of signals in a mark length detection portion;

FIGS. 19A, 19B, 19C, 19D, 19E, 19F, 19G, 19H, 19I, 19J, 19K, 19L, 19M, 19N, 19O, 19P, 19Q, 19R, 19S and 19T are timing charts of signals in the space length detection portion;

DESCRIPTION OF THE PREFERRED EMBODIMENTS

Preferred embodiments of the present invention will now be described with reference to the drawings.

Figure 1:
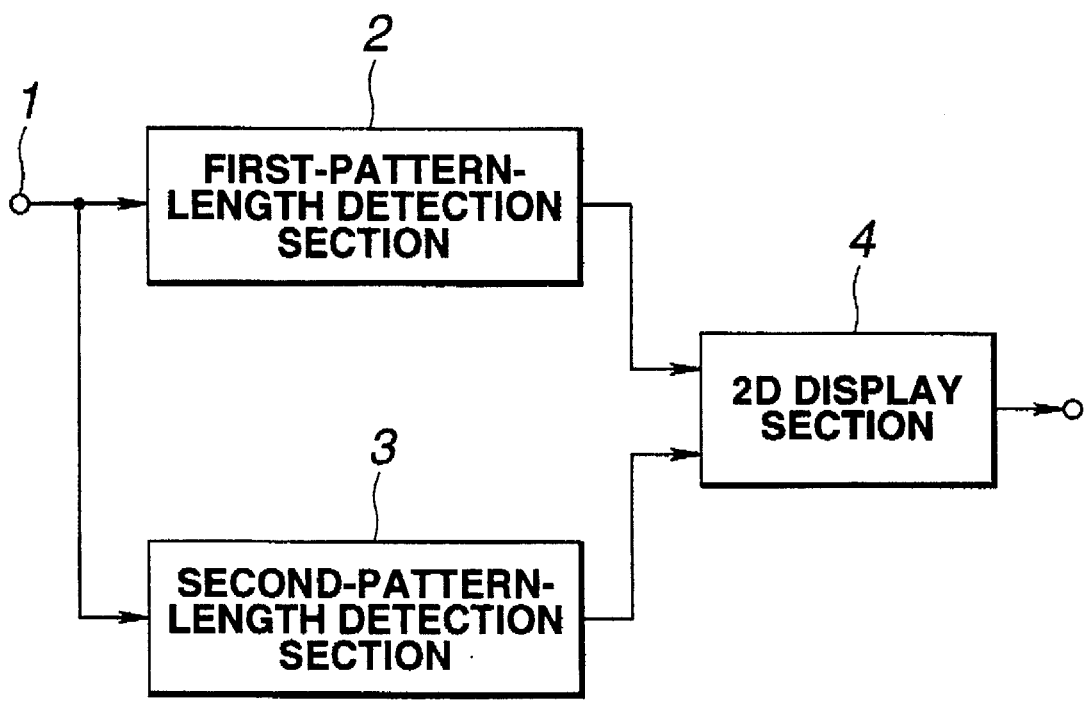
FIG. 1 is a schematic view showing an embodiment of a signal measurement apparatus according to the present invention.

FIG. 1 shows the schematic structure of an embodiment of a signal measurement apparatus according to the present invention. The signal measurement apparatus includes a first-pattern-length detection section 2 which is a first-pattern-length detection means for detecting a first pattern length corresponding to a first edge interval of a digital signal; a second-pattern-length detection section 3 which is a second-pattern-length detection means for detecting a second pattern length corresponding to a second edge interval; and a 2D display section 4 for receiving information of the first pattern length supplied from the first-pattern-length detection section 2 as the X-axis input and information of the second pattern length supplied from the second-pattern-length detection section 3 as the Y-axis input so as to perform 2D display.

Initially, the phase of reproduced data of a pattern recorded on a recording medium will now be described.

FIG. 2A shows a portion of, for example, digital signals successively recorded on a recording medium, the foregoing portion consisting of a so-called mark M, which is a recorded signal portion in which a signal has been recorded and a so-called space S, which is a non-signal portion in which no signal is recorded. The mark M and space S are called patterns, and the length of the pattern is called a pattern length. Variables g, h, i, j and k given to the mark M and space S have values in a predetermined range which is, in this embodiment, 2 to 8.

FIG. 2B shows RF data obtained by reading and reproducing marks hM and jM and by converting the same into a logic signal for the I/O by a binary-coding circuit. The ideal leading edge and tailing edge of RF data are at positions indicated by a solid line. However, the positions of the leading edge and tailing edge of RF data to be actually reproduced are somewhat deviated from the ideal positions of the leading edge and the tailing edge. The positions are, for example, as indicated by a doted line.

A reproduction clock signal generated by the PLL circuit by using the RF data is shown in FIG. 2C, one period of the reproduction clock signal being indicated by 1T. Each pulse generated by the reproduction clock signal and the leading edges of the mark hM and the mark jM shown in FIG. 2B is shown in FIG. 2D. Each pulse generated by the reproducing clock signal and the tailing edges of the mark hM and the mark jM shown in FIG. 2B is shown in FIG. 2E. Each pulse shown in FIG. 2D has phase information of leading edges of the mark hM and the mark jM, while each pulse shown in FIG. 2E has phase information of tailing edges of the mark hM and the mark jM. The phase information is the position deviation of the edge, that is, the amount of shift and fluctuation.

The width of each of the pulses shown in FIGS. 2D and 2E, which correspond to the ideal RF data indicated by the solid line shown in FIG. 2B, is T/2 without exception. On the other hand, pulses showing the phase information of the leading edge or the tailing edge shown in FIGS. 2D and 2E and corresponding to RF data which is the leading edge or the tailing edge at the position indicated by the doted line shown in FIG. 2B is the leading edge or the tailing edge indicated by the doted line. The foregoing pulses have different widths.

The amount of shift and the fluctuation, which are phase information of the leading edges of the mark hM and the mark jM shown in FIG. 2D, are schematically indicated by distribution graphs 100 and 101. On the other hand, the amount of shift and the fluctuation, which are phase information of the tailing edges of the mark hM and the mark jM shown in FIG. 2E, are schematically indicated by distribution graphs 102 and 103.

The conventional method of evaluating the recorded pattern of the digital signal uses the phase information indicated by the distribution graphs 100, 101, 102 and 103 as jitter components, and performs evaluation in the way that the amounts of variation are superimposed on the same time base to obtain jitters as shown in FIG. 3A or the same are rearranged on time axis for each mark as shown in FIG. 3B. Thus, jitters for each mark are obtained to perform evaluation.

On the other hand, the method of evaluating a recorded pattern of a digital signal by the signal measurement method according to the present invention takes advantage of a fact that the edge phase of the RF data is equivalent to the phase of the reproduction clock signal to measure each of the pattern lengths of two recorded patterns including the edge phase information. Moreover, the two pattern lengths are 2D-displayed.

Specifically, RF data which is binary-coded data obtained by reproducing and binary-coding a digital-recorded signal, and latch data obtained by latching the RF data with a reproduction clock signal reproduced by using the RF data are supplied from a signal input terminal 1 shown in FIG. 1. The RF data and latch data are supplied to the first-pattern-length detection section 2 and the second-pattern-length detection section 3 respectively.

In the first-pattern-length detection section 2 and the second-pattern-length detection section 3, pattern lengths in predetermined patterns are measured and detected respectively. The first pattern length and the second pattern length are supplied to the 2D display section 4 from the corresponding first-pattern-length detection section 2 and the second-pattern-length detection section 3. The 2D display section 4 plots the first pattern lengths as the X-axis input and the second pattern lengths as the Y-axis input to 2D-display the results of plotting.

The first pattern length and the second pattern length include the phase of either of the leading edge or the tailing edge.

The phase of the edge is detected by comparing the phase of the binary-coded data and data obtained by latching the binary-coded data with the reproduction clock signal while using the phase of the reproduction clock signal, which is generated by using the binary-coded data, as a reference phase.

In a case where the first pattern length is a pattern length corresponding to the length of data corresponding to a non-signal portion in the binary-coded data and the second pattern length is a pattern length corresponding to the length of data corresponding to the signal recorded portion following the non-signal portion, or in a case where the first pattern length is a pattern length corresponding to the length of data corresponding to the signal recorded portion in the binary-coded data and the second pattern length is a pattern length corresponding to the length of data corresponding to the non-signal portion following the signal recorded portion, the evaluation of the digital-recorded pattern is performed.

In a case where the first pattern length is a pattern length corresponding to the length of data corresponding to the forward signal recorded portion and the second pattern length is a pattern length corresponding to the length of data corresponding to a signal recorded portion following the forward signal recorded portion, the evaluation of the digital-recorded pattern is performed.

That is, the pattern length of the space S and the pattern length of the mark M are used to evaluate the amount of shift and the fluctuation, which are phase information of one edge between two patterns, in accordance with the relationship between the two pattern lengths. The pattern lengths of two marks M are used to evaluate the amount of shift and fluctuation, which are phase information of the two edges, in accordance with the relationship between the two pattern lengths.

The two evaluation methods are used to evaluate the phase of the leading edge or to evaluate the phase of the tailing edge.

As to the mark M of a recorded pattern, in an evaluation which uses the pattern length of certain space S including phase information of the tailing edge and the pattern length of mark M including phase information of the leading edge and following the space S, the phase of the leading edge of the mark M is evaluated. In an evaluation which uses the pattern length of certain mark M including phase information of the tailing edge and the pattern length of space S including phase information of the leading edge and following the mark M, the phase of the tailing edge of the mark M is evaluated.

Specifically, the case where the phase of the leading edge is evaluated will now be described.

Pulses generated by the leading edge of binary-coded data obtained by reproducing mark hM and mark jM shown in FIG. 4A and the reproduction clock signal to be reproduced as described above are shown in FIG. 4B. The amount of shift and the fluctuation of the edge indicated by the foregoing pulses are schematically indicated by distribution graphs 90 and 91. That is, the distribution graph 90 shows the amount of shift and the fluctuation of the leading edge of the mark hM. The distribution graph 91 shows the amount of shift and the fluctuation of the leading edge of the mark jM and shows the amount of shift and the fluctuation of the tailing edge of the space iS.

As shown in FIG. 5A, the pattern length of the space iS is plotted on the X axis, while the pattern length of the mark jM is plotted on the Y axis. Thus, a plot data 94 can be obtained. As a result, the amount of shift and the state of fluctuation of one leading edge between the space iS and the mark jM can be evaluated. As shown in FIG. 5B, the pattern length of the mark hM is plotted on the X axis, while the pattern length of the mark jM is plotted on the Y axis. Thus, a plot data 95 can be obtained. As a result, the amounts of shift and fluctuation of two leading edges between the mark hM and the mark jM can be individually evaluated.

The case where the phase of the tailing edge is evaluated will now be described.

Figures 6A, 6B:
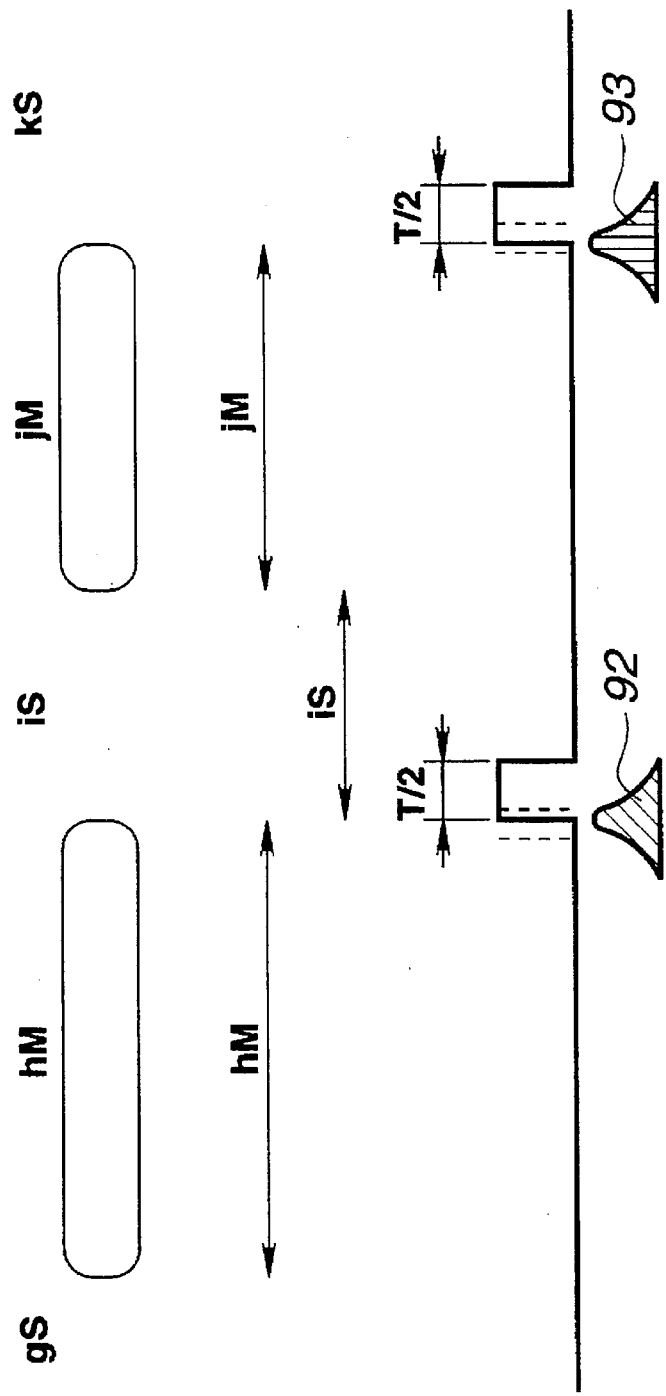
FIGS. 6A and 6B are diagrams for explaining the amount of shift and the fluctuation of the phase of a tailing edge of the recorded signal.

Pulses generated by the trailing edge of binary-coded data obtained by reproducing mark hM and mark jM shown in FIG. 6A and the reproduction clock signal to be reproduced as described above are shown in FIG. 6B. The amount of shift and the fluctuation of the edge indicated by the foregoing pulses are schematically indicated by distribution graphs 92 and 93. That is, the distribution graph 92 shows the amount of shift and the fluctuation of the trailing edge of the mark hM and the amount of shift and the fluctuation of the leading edge of the space iS. The distribution graph 93 shows the amount of shift and the fluctuation of the trailing edge of the mark jM.

Therefore, as shown in FIG. 7A, the pattern length of the mark hM is plotted on the X axis, while the pattern length of the space iS is plotted on the Y axis. Thus, a plot data 96 can be obtained. As a result, the amount of shift and the state of fluctuation of one trailing edge between the mark hM and the space iS can be evaluated. As shown in FIG. 7B, the pattern length of the mark hM is plotted on the X axis, while the pattern length of the mark jM is plotted on the Y axis. Thus, a plot data 97 can be obtained. As a result, the amounts of shift and fluctuation of two trailing edges between the mark hM and the mark jM can individually be evaluated.

Figure 8:
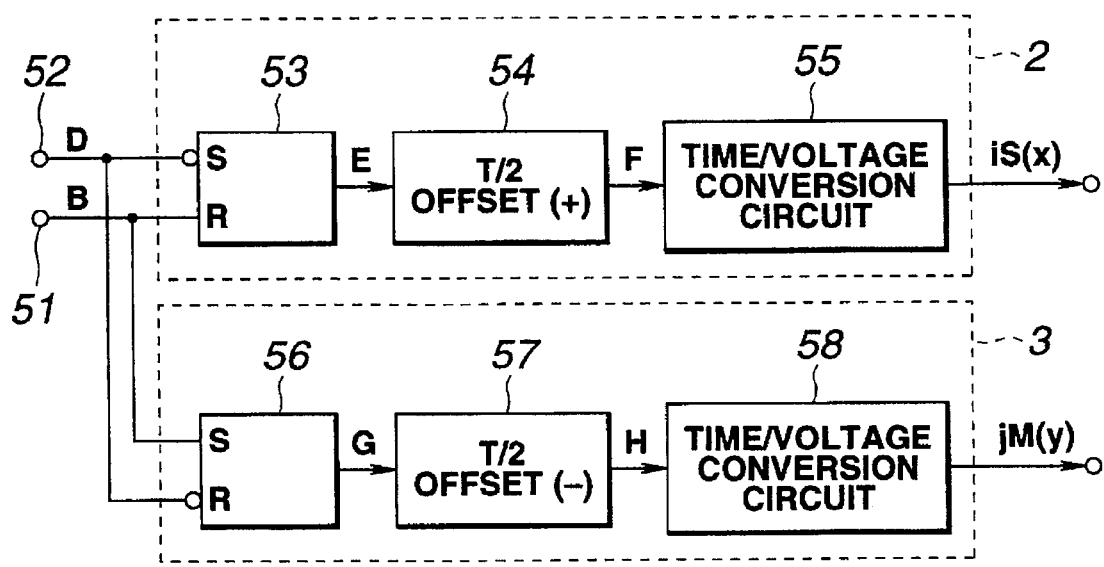
FIG. 8 is a schematic view showing the structure of a signal measurement apparatus according to a first embodiment of the present invention.

The schematic structure of the signal measurement apparatus according to a first embodiment of the present invention is shown in FIG. 8. The signal measurement apparatus according to the first embodiment is a signal measurement apparatus for measuring the pattern length of the space S and the pattern length of the mark M following the space S.

Figure 9:
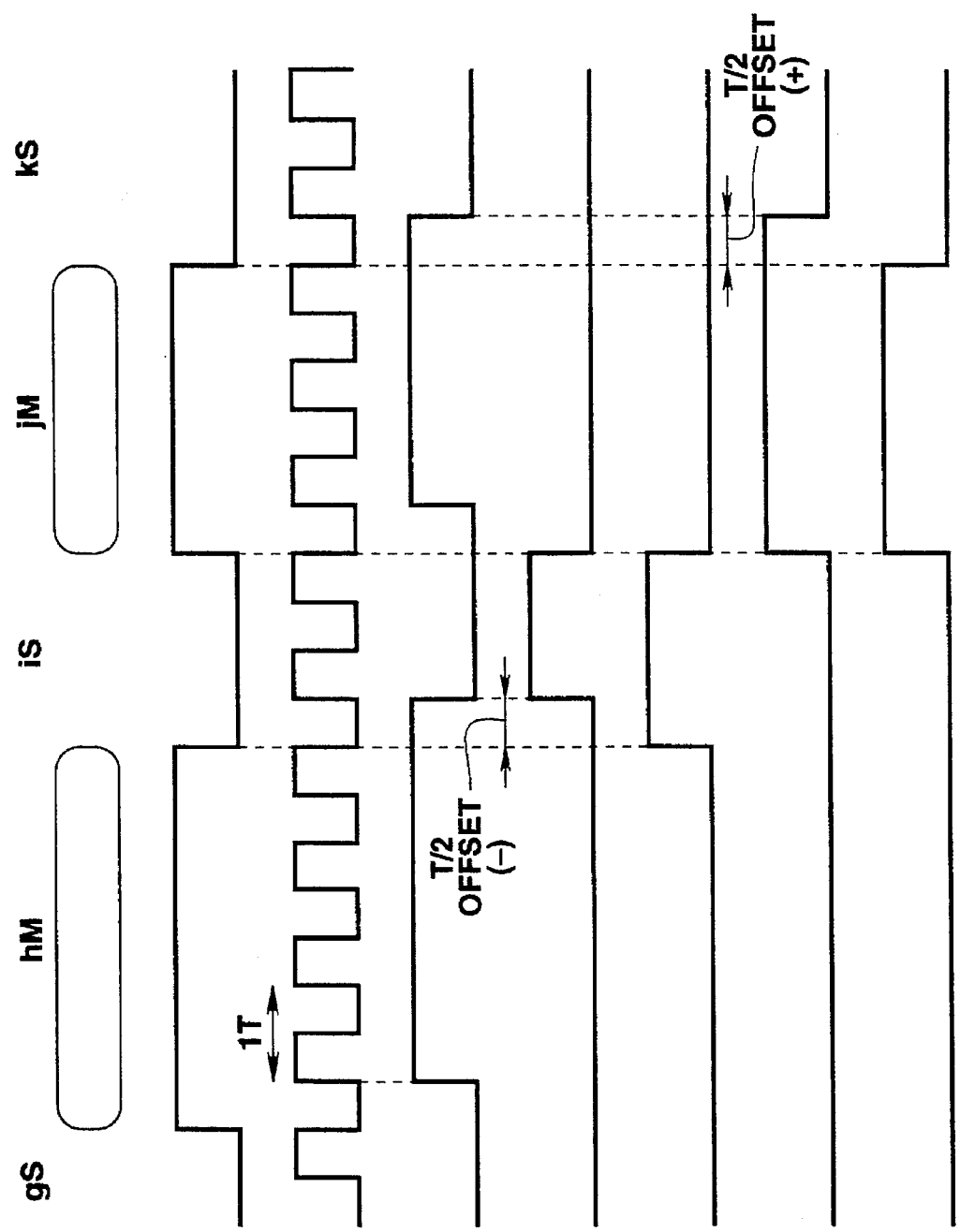
FIGS. 9A, 9B, 9C, 9D, 9E, 9F, 9G and 9H are timing charts of signals in the signal measurement apparatus shown in FIG. 8.

In the signal measurement apparatus according to the first embodiment, RF data, which is binary-coded data obtained by reproducing the mark jM and the mark hM of the recorded signal shown in FIG. 9A is formed into a signal shown in FIG. 9B. A reproduction clock signal generated by the PLL circuit by using the RF data is formed as shown in FIG. 9C. The period of the reproduction clock signal is made to be 1T. Latch data obtained by latching the RF data shown in FIG. 9B by using the reproduction clock signal is formed as shown in FIG. 9D.

The signal measurement apparatus according to the first embodiment measures the pattern length of the space iS including phase information of the tailing edge of the mark hM and the pattern length of the mark jM including phase information of the leading edge following the space iS.

Initially, the RF data shown in FIG. 9B is supplied to a signal input terminal 51 shown in FIG. 8, while the latch data shown in FIG. 9D is supplied to a signal input terminal 52. The RF data and the latch data are supplied to a gate circuit 53 of the first-pattern-length detection section 2 and the gate circuit 56 of the second-pattern-length detection section 3 respectively.

The gate circuit 53 is supplied with a reverse signal of the latch data as a set signal and the RF data as the reset signal so that a signal shown in FIG. 9E is transmitted. The signal shown in FIG. 9E is a signal having a length obtained by subtracting the length corresponding to the pulse having the period T/2 from the pattern length of the space iS. The signal shown in FIG. 9E is supplied to an adder 54, and then the length corresponding to the width of the pulse having the period T/2 is added. Thus, a signal shown in FIG. 9F is transmitted. The signal shown in FIG. 9F is converted into voltage by a time/voltage conversion circuit 55 so as to be transmitted.

The gate circuit 56 is supplied with the RF data as a set signal and the reverse signal of the latch data as the reset signal so that a signal shown in FIG. 9G is transmitted. The signal shown in FIG. 9G is a signal having a length obtained by adding the width of the pulse having the period T/2 to the pattern length of the mark jM. The signal shown in FIG. 9G is supplied to a subtractor 57, and then the length corresponding to the width of the pulse having the period T/2 is subtracted. Thus, a signal shown in FIG. 9H is transmitted. The signal shown in FIG. 9H is converted into voltage by a time/voltage conversion circuit 58 so as to be transmitted.

Then, the pattern length of the space iS supplied from the first-pattern-length detection section 1 is plotted on the X axis and the pattern length of the mark jM supplied from the second-pattern-length detection section 2 is plotted on the Y axis in a 2D configuration. As a result, the recorded pattern of a digital signal is evaluated by using phase information of one leading edge.

Figure 10:
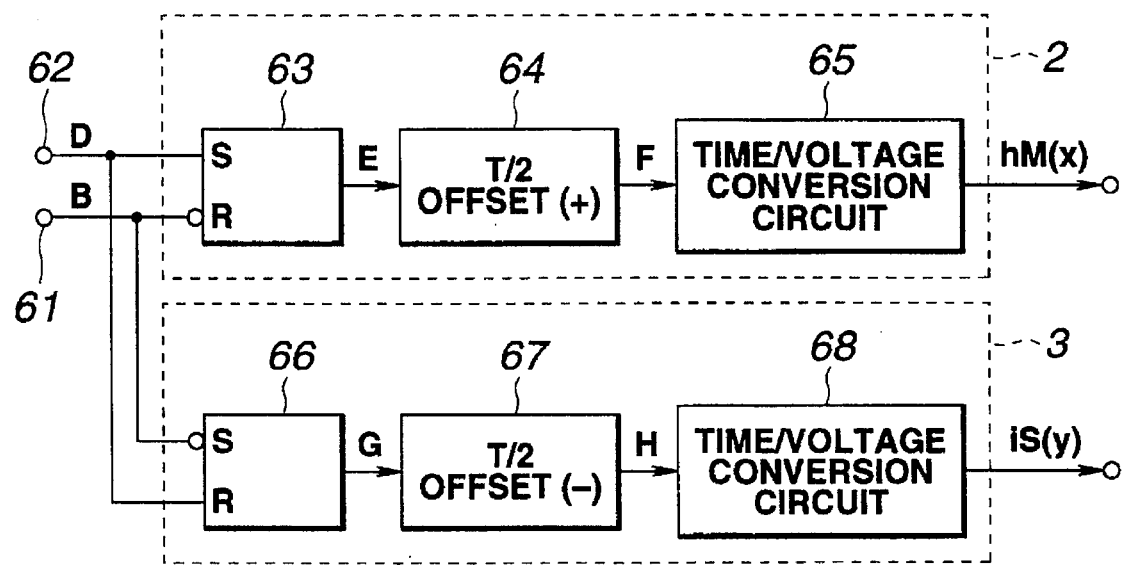
FIG. 10 is a schematic view showing the structure of the signal measurement apparatus according to a second embodiment of the present invention.

The schematic structure of the signal measurement apparatus according to a second embodiment of the present invention is shown in FIG. 10. The signal measurement apparatus according to the second embodiment is a signal measurement apparatus for measuring the pattern length of the mark M and the pattern length of the space S following the mark M.

Figure 11:
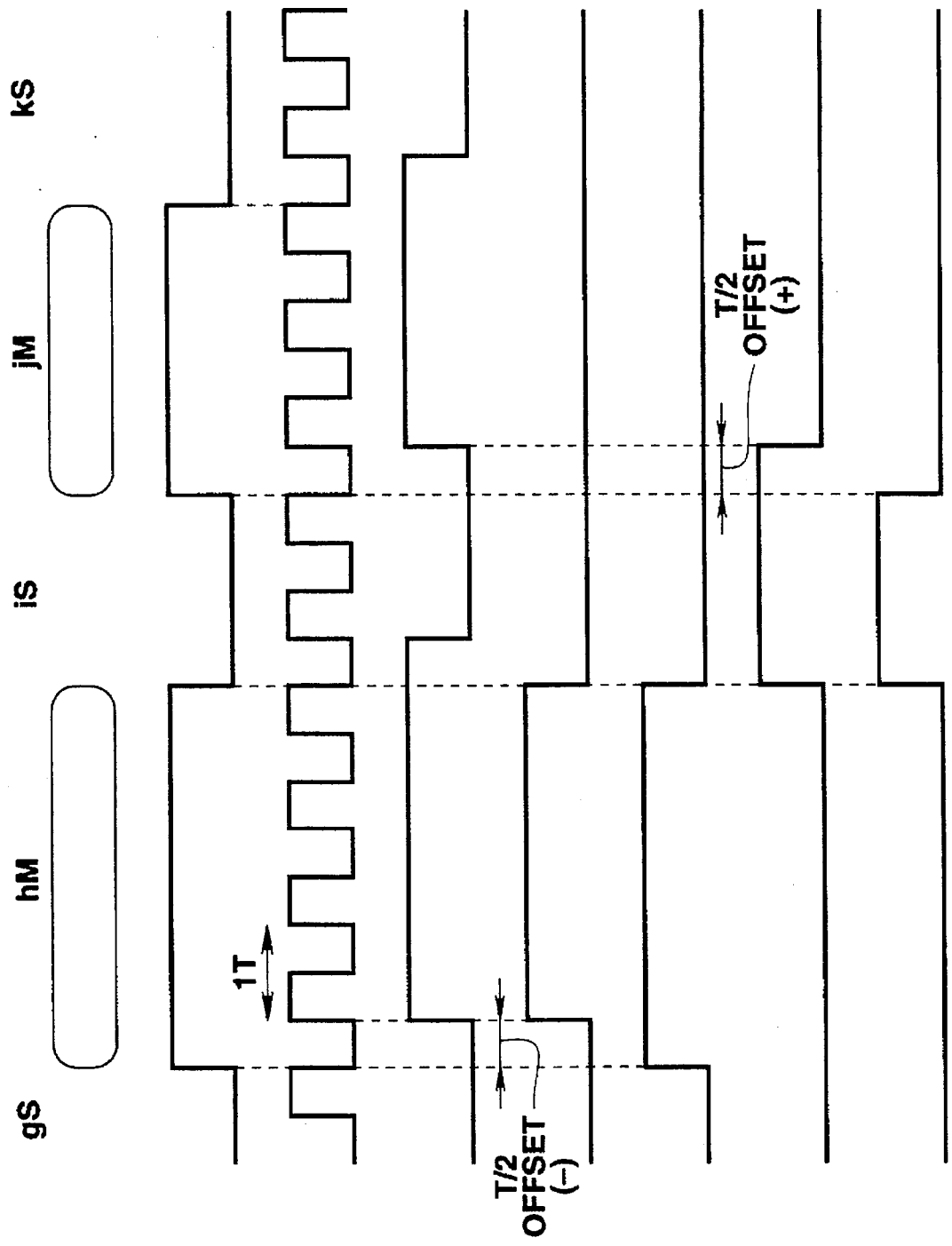
FIGS. 11A, 11B, 11C, 11D, 11E, 11F, 11G and 11H are timing charts of signals in the signal measurement apparatus shown in FIG. 10.

In the signal measurement apparatus according to the second embodiment, RF data which is binary-coded data obtained by reproducing the mark jM and the mark hM of the recorded signal shown in FIG. 11A is formed into a signal shown in FIG. 11B. A reproduction clock signal generated by the PLL circuit by using the RF data is formed as shown in FIG. 11C. Latch data obtained by latching the RF data shown in FIG. 11B by using the reproduction clock signal is formed as shown in FIG. 11D.

The signal measurement apparatus according to the second embodiment measures the pattern length of the mark hM including phase information of the tailing edge and the pattern length of the space iS including phase information of the leading edge following the mark hM.

Initially, the RF data shown in FIG. 11B is supplied to a signal input terminal 61 shown in FIG. 10, while the latch data shown in FIG. 11D is supplied to a signal input terminal 62. The RF data and the latch data are supplied to a gate circuit 63 of the first-pattern-length detection section 2 and the gate circuit 66 of the second-pattern-length detection section 3 respectively.

The gate circuit 63 is supplied with the latch data as a set signal and the reverse signal of the RF data as the reset signal so that a signal shown in FIG. 11E is transmitted. The signal shown in FIG. 11E is a signal having a length obtained by subtracting the length corresponding to the pulse having the period T/2 from the pattern length of the mark hM. The signal shown in FIG. 11E is supplied to an adder 64, and then the length corresponding to the width of the pulse having the period T/2 is added. Thus, a signal shown in FIG. 11F is transmitted. The signal shown in FIG. 11F is converted into voltage by a time/voltage conversion circuit 65 so as to be transmitted.

The gate circuit 66 is supplied with the latch data as a set signal and the reverse signal of the RF data as the reset signal so that a signal shown in FIG. 11G is transmitted. The signal shown in FIG. 11G is a signal having a length obtained by adding the length corresponding to the width of the pulse having the period T/2 from the pattern length of the space iS. The signal shown in FIG. 11G is supplied to an subtractor 67, and then the length corresponding to the width of the pulse having the period T/2 is subtracted. Thus, a signal shown in FIG. 11H is transmitted. The signal shown in FIG. 11H is converted into voltage by a time/voltage conversion circuit 68 so as to be transmitted.

Then, the pattern length of the mark hM supplied from the pattern length detection section 1 is plotted on the X axis and the pattern length of the space iS supplied from the first-pattern-length detection section 2 is plotted on the Y axis in a 2D configuration. As a result, the recorded pattern of a digital signal is evaluated by using phase information of one trailing edge.

As described above, when the phase information of the leading edge is used in a case where the phase information of one edge is used, the pattern length of the space S is plotted on the X axis and the pattern length of the mark M is plotted on the Y axis so that the evaluation is performed. When phase information of the tailing edge is used, the pattern length of the mark M is plotted on the X axis and the pattern length of the space S is plotted on the Y axis so that the evaluation is performed.

Figure 12:
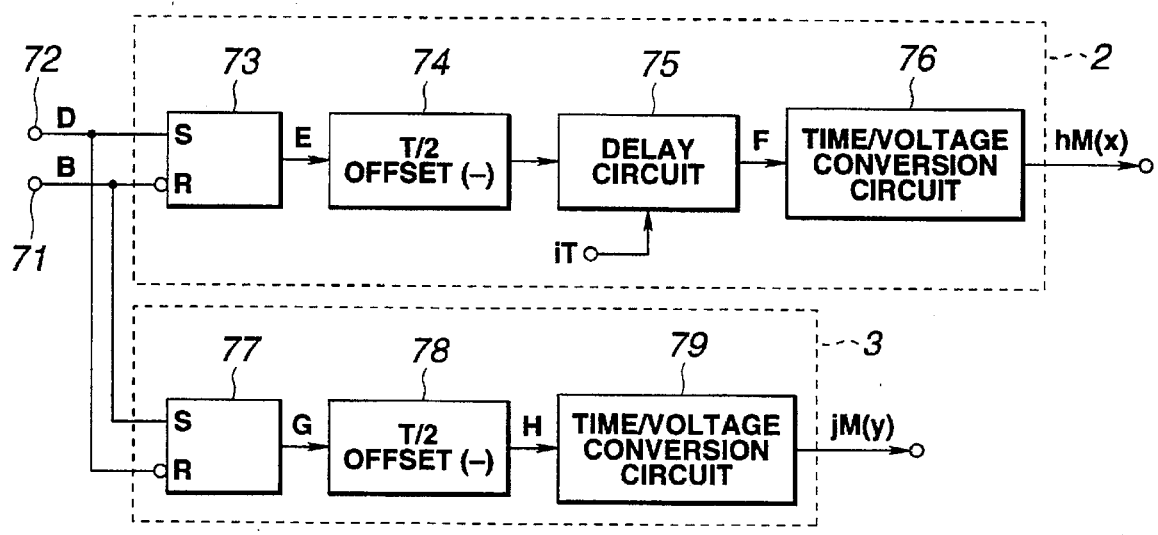
FIG. 12 is a schematic view showing the structure of the signal measurement apparatus according to a third embodiment of the present invention.

The schematic structure of the signal measurement apparatus according to a third embodiment of the present invention is shown in FIG. 12. The signal measurement apparatus according to the third embodiment is a signal measurement apparatus for measuring the pattern lengths of two marks M.

Figure 13:
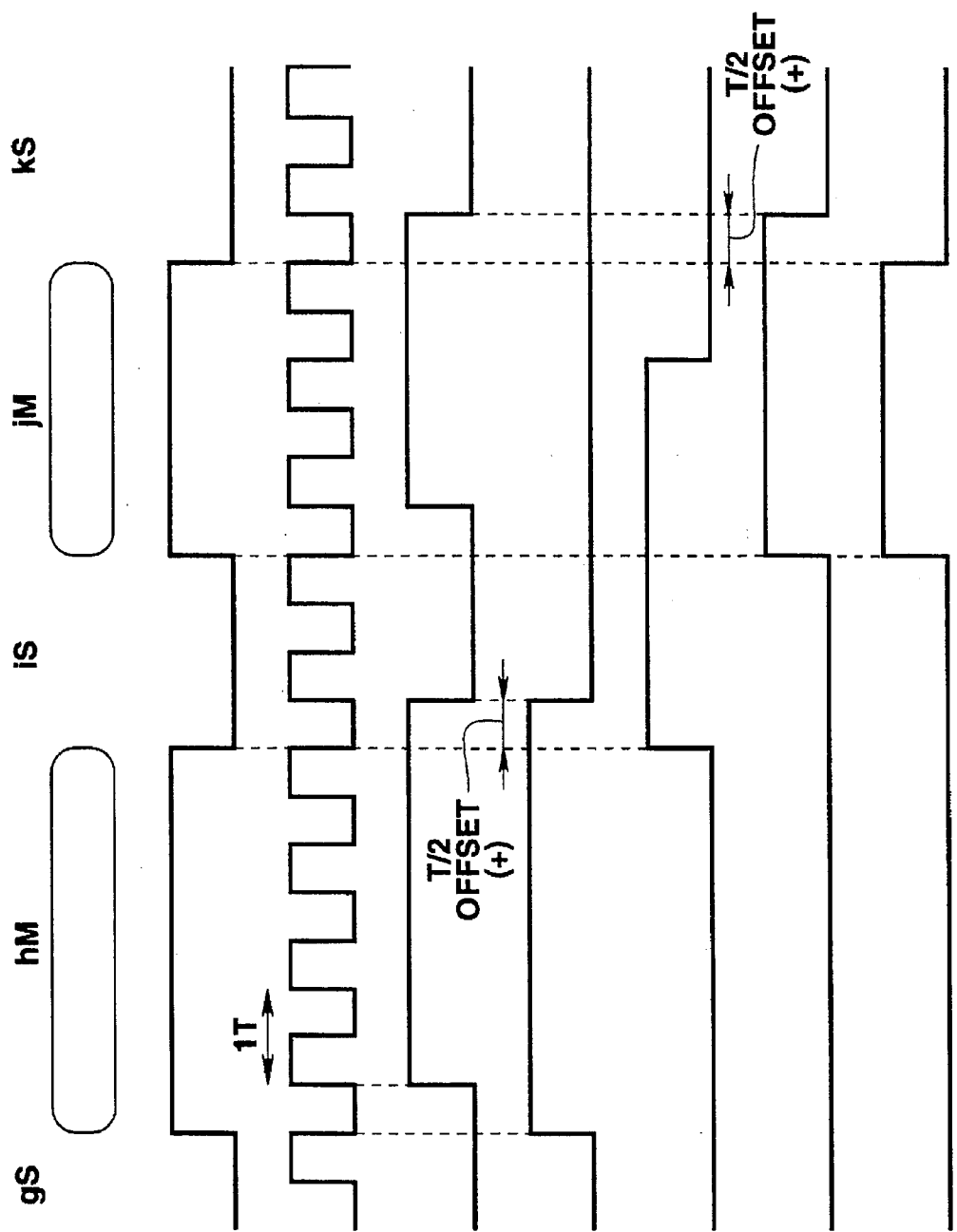
FIGS. 13A, 13B, 13C, 13D, 13E, 13F, 13G and 13H are timing charts of signals in the signal measurement apparatus shown in FIG. 12.

In the signal measurement apparatus according to the third embodiment, RF data which is binary-coded data obtained by reproducing the mark jM and the mark hM of the recorded signal shown in FIG. 13A is formed into a signal shown in FIG. 13B. A reproduction clock signal generated by the PLL circuit by using the RF data is formed as shown in FIG. 13C. Latch data obtained by latching the RF data shown in FIG. 13B by using the reproduction clock signal is formed as shown in FIG. 13D.

The signal measurement apparatus according to the third embodiment measures the pattern length of the mark hM including phase information of the leading edge and the pattern length of the mark jM including phase information of the leading edge recorded to follow the mark hM.

Initially, the RF data shown in FIG. 13B is supplied to a signal input terminal 71 shown in FIG. 12, while the latch data shown in FIG. 13D is supplied to a signal input terminal 72. The RF data and the latch data are supplied to a gate circuit 73 of the first-pattern-length detection section 2 and a gate circuit 77 of the second-pattern-length detection section 3 respectively.

The gate circuit 73 is supplied with the RF data as a set signal and the reverse signal of the latch data as the reset signal so that a signal shown in FIG. 13E is transmitted. The signal shown in FIG. 13E is a signal having a length obtained by adding the width of the pulse having the period T/2 to the pattern length of the mark hM. The signal shown in FIG. 13E is supplied to a subtractor 74, and then the width of the pulse having the period T/2 is subtracted. Thus, a signal shown in FIG. 13F is transmitted. The signal shown in FIG. 13F is delayed by supplied time iT in the delay circuit 75, and then converted into voltage by a time/voltage conversion circuit 76 so as to be transmitted.

The gate circuit 77 is supplied with the RF data as a set signal and the reverse signal of the latch data as the reset signal so that a signal shown in FIG. 13G is transmitted. The signal shown in FIG. 13G is a signal having a length obtained by adding the length corresponding to the width of the pulse having the period T/2 to the pattern length of the mark jM. The signal shown in FIG. 13G is supplied to a subtractor 78, and then the length corresponding to the width of the pulse having the period T/2 is subtracted. Thus, a signal shown in FIG. 13H is transmitted. The signal shown in FIG. 13H is converted into voltage by a time/voltage conversion circuit 79 so as to be transmitted.

Then, the pattern length of the mark hM supplied from the pattern length detection section 1 is plotted on the X axis and the pattern length of the mark jM supplied from the firstpattern-length detection section 2 is plotted on the Y axis in a 2D configuration. As a result, the recorded pattern of a digital signal is evaluated by using phase information of two leading edges.

Figure 14:
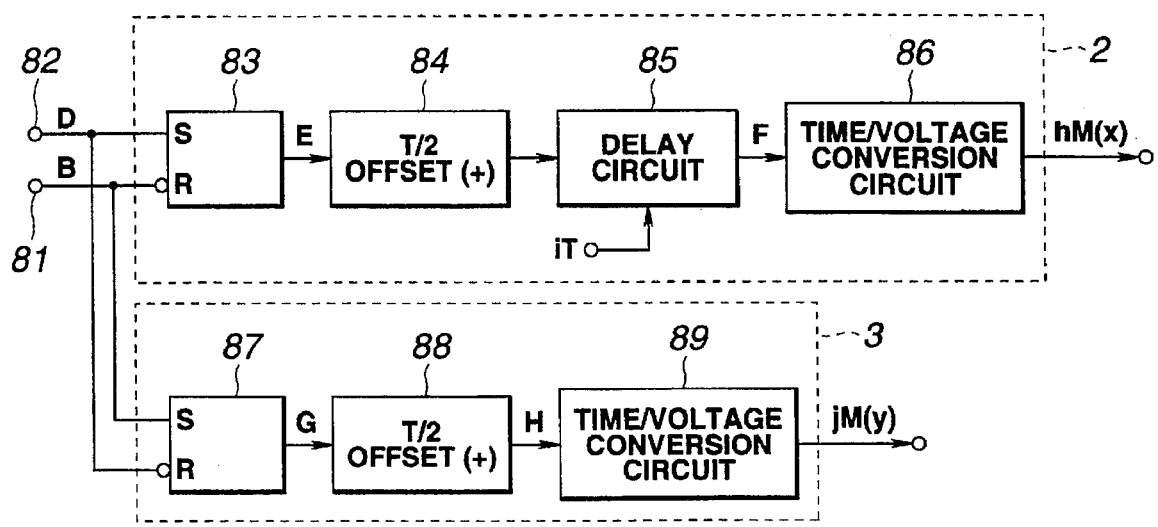
FIG. 14 is a schematic view showing the structure of the signal measurement apparatus according to a fourth embodiment of the present invention.

The schematic structure of the signal measurement apparatus according to a fourth embodiment of the present invention is shown in FIG. 14. The signal measurement apparatus according to the fourth embodiment is a signal measurement apparatus for measuring the pattern lengths of two marks M.

In the signal measurement apparatus according to the fourth embodiment, RF data which is binary-coded data obtained by reproducing the mark jM and the mark hM of the recorded signal shown in FIG. 15A is formed into a signal shown in FIG. 15B. A reproduction clock signal generated by the PLL circuit by using the RF data is formed as shown in FIG. 15C. Latch data obtained by latching the RF data shown in FIG. 15B by using the reproduction clock signal is formed as shown in FIG. 15D.

The signal measurement apparatus according to the fourth embodiment measure the pattern length of the mark hM including the phase information of the tailing edge and the pattern length of the mark jM including the phase information of the tailing edge recorded following the mark hM.

Initially, the RF data shown in FIG. 15B is supplied to a signal input terminal 81 shown in FIG. 14, while the latch data shown in FIG. 15D is supplied to a signal input terminal 82. The RF data and the latch data are supplied to a gate circuit 83 of the first-pattern-length detection section 2 and a gate circuit 87 of the second-pattern-length detection section 3 respectively.

The gate circuit 83 is supplied with the latch data as a set signal and the reverse signal of the RF data as the reset signal so that a signal shown in FIG. 15E is transmitted. The signal shown in FIG. 15E is a signal having a length obtained by subtracting the length corresponding to the width of the pulse having the period T/2 from the pattern length of the mark hM. The signal shown in FIG. 15E is supplied to an adder 84, and then the length corresponding to the width of the pulse having the period T/2 is added. Thus, a signal shown in FIG. 15F is transmitted. The signal shown in FIG. 15F is delayed by supplied time iT in a delay circuit 85, and then converted into voltage by a time/voltage conversion circuit 86 so as to be transmitted.

The gate circuit 87 is supplied with the latch data as a set signal and the reverse signal of the RF data as the reset signal so that a signal shown in FIG. 15G is transmitted. The signal shown in FIG. 15G is a signal having a length obtained by subtracting the length corresponding to the width of the pulse having the period T/2 from the pattern length of the mark jM. The signal shown in FIG. 15G is supplied to an adder 88, and then the length corresponding to the width of the pulse having the period T/2 is added. Thus, a signal shown in FIG. 15H is transmitted. The signal shown in FIG. 15H is converted into voltage by a time/voltage conversion circuit 89 so as to be transmitted.

Then, the pattern length of the mark hM supplied from the pattern length detection section 1 is plotted on the X axis and the pattern length of the mark jM supplied from the first-pattern-length detection section 2 is plotted on the Y axis in a 2D configuration. As a result, the recorded pattern of a digital signal is evaluated by using phase information of two leading edges.

Figure 16A:
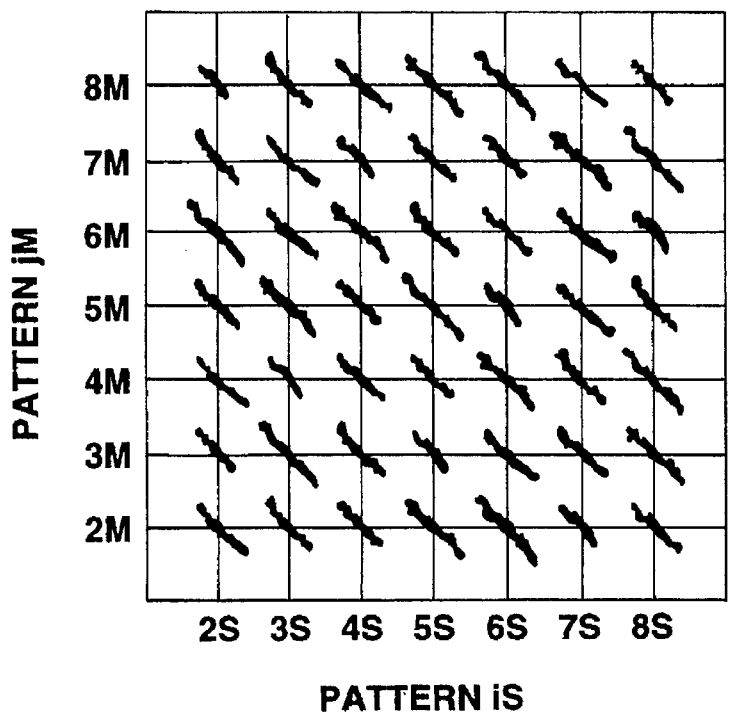
FIGS. 16A and 16B are diagrams showing 2D-mapping.

Specifically, the pattern lengths of the plural spaces iS and pattern lengths of the marks jM measured by the signal measurement apparatus according to the first embodiment are plotted and 2D-displayed resulting in a diagram (map) as shown in FIG. 16A. Referring to FIG. 16A, the length of the plotted data indicates the fluctuation of the leading edge. The mean value of the plotted data, that is, the deviation from the central point of the length to the lattice point indicates the amount of shift of the edge. The plotted data can be used to evaluate the phase of one edge. Among the plotted data, ideal plotted data is one the center of which is the lattice point and which has a short length.

Also the results of plotting using the pattern lengths of the marks hM and the pattern lengths of the spaces iS measured by the signal measurement apparatus according to the second embodiment are 2D-displayed as shown in FIG. 16A.

Figure 16B:
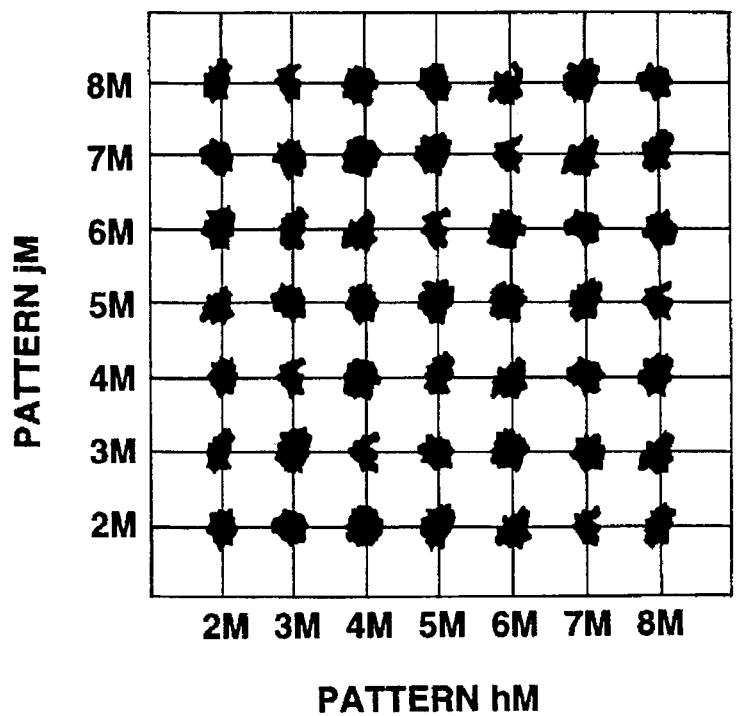

Specifically, results of plotting using pattern lengths of the plural marks hM and the pattern lengths of the marks jM are 2D-displayed as shown in FIG. 16B. Referring to FIG. 16B, the diameter of each circle indicates the fluctuation of the edge when the plotted data is assumed to be circles. The deviation from the central point of the circle to the lattice point indicates the amount of shift of the edge. By using the plotted data, the correlation of the phases of the two edges can be evaluated. If the plotted data is in the form of an ellipse, great correlation is indicated. Ideal plotted data is one the central point of which is the lattice point and in the form of a circle having a short diameter.

Figure 17:
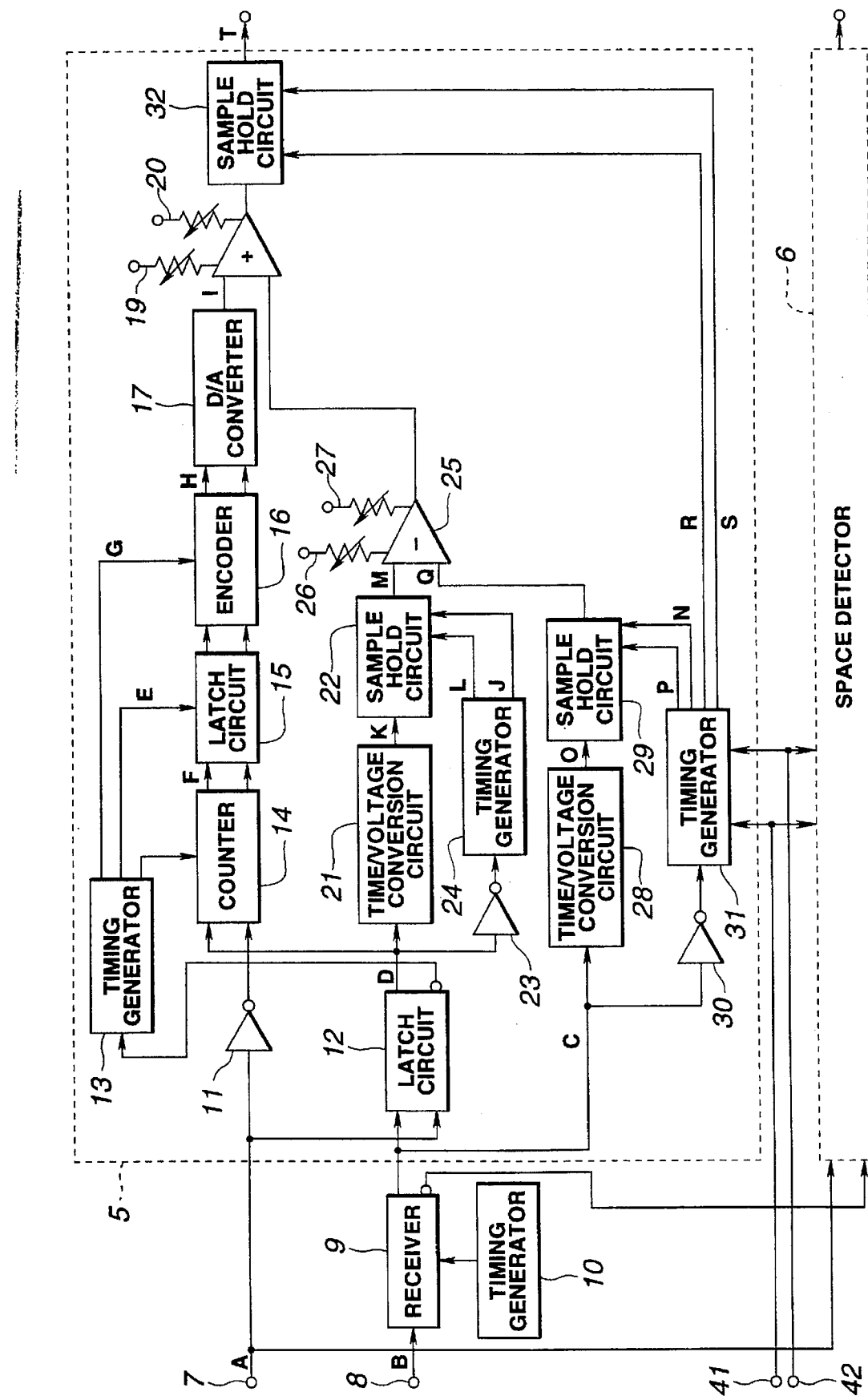
FIG. 17 is a specific structural view of another signal measurement apparatus.

The specific structure of another signal measurement apparatus for measuring the pattern length of the mark M and the space S by the foregoing signal measurement method is shown in FIG. 17. The foregoing signal measurement apparatus has three detection modes consisting of a mark and space detection mode, a mark detection mode and a space detection mode with which the pattern lengths of the mark M and the space S are measured and 2D-displayed to evaluate the recorded pattern of a digital signal. Since a space detection section 6 of this signal measurement apparatus has the same structure as that of a mark detection section 5, the internal structure is omitted from description.

The signal measurement apparatus shown in FIG. 17 includes a mark detection section 5 corresponding to the first-pattern-length detection section 2 shown in FIG. 1; and a space detection section 6 corresponding to the second-pattern-length detection section 3 shown in FIG. 1, A display section corresponding to the 2D display section 4 shown in FIG. 1 is omitted from illustration.

RF data RFDT, shown in FIG. 18B, obtained by reproducing and binary-coding the recorded pattern is supplied through a signal input terminal 8, and then transmitted to a receiver 9. Note that the pattern of the RF data RFDT is in the form of repetition of fixed patterns in order to simplify the description. Similarly, FIG. 19 shows the pattern of the RF data RFDT in the form of repetition of fixed patterns.

The receiver 9 performs a gate process in which a gate signal supplied from a timing generator 10 is used to erase system information and so forth from the RF data. Note that the gate signal is generated due to input of a 1-rotation synchronizing signal, a system-information position signal, data-position information signal and so forth to a timing generator 10. Output signal RCVDT shown in FIG. 18C from the receiver 9 is supplied to a latch circuit 12, a time/voltage conversion circuit 28 and an inverter 30.

In the latch circuit 12, reproduction clock signal CLK generated by the PLL circuit by using the RF data RFDT, shown in FIG. 18A, is supplied through a signal input terminal 7. In response to the reproduction clock signal CLK, output signal RCVDT supplied from the receiver 9 is read so that latch data LTDT shown in FIG. 18D is transmitted. The latch data LTDT is supplied to a counter 14, a time/voltage conversion circuit 21 and an inverter 23. A reverse signal of the latch data LTDT is supplied to a timing generator 13.

In the time/voltage conversion circuit 21, the latch data LTDT is converted into voltage so that voltage data $TVCNV_1$ shown in FIG. 18K is supplied to a sample hold circuit 22. The latch data LTDT is supplied to a timing generator 24 through the inverter 23.

The timing generator 24 generates timing signal $MHLD_1$ shown in FIG. 18L at the tailing edge of the latch data LTDT. Then, the timing signal $MHLD_1$ and reset signal $MRST_1$ shown in FIG. 18J are transmitted to the sample hold circuit 22.

Therefore, the sample hold circuit 22 sample-holds the voltage data TVCNV1 in response to the timing signal $MHLD_1$, and then resets the signal $MRST_1$ so that hold output $M_1$ shown in FIG. 18M is transmitted. The hold output $M_1$ is supplied to a subtractor 25.

Simultaneously, the time/voltage conversion circuit 28 converts the RF data RFDT, which is the pattern length, into voltage so that voltage data $TVCNV_2$ shown in FIG. 18O is transmitted to the time/voltage conversion circuit 28. The RF data RFDT is, through the inverter 30, supplied to a timing generator 31.

The timing generator 31 generates timing signal $MHLD_2$ shown in FIG. 18P at the tailing edge of the RF data RFDT. The timing signal $MHLD_2$ and reset signal $MRST_2$ shown in FIG. 18N are transmitted to a sample hold circuit 29.

Therefore, the sample hold circuit 29 sample-holds the voltage data TVCNV2 in response to the timing signal $MHLD_2$, and then resetting is performed with the reset signal $MRST_2$ so that hold output $M_2$ shown in FIG. 18Q is transmitted. The hold output M2 is supplied to the subtractor 25.

In the subtractor 25, the gain is adjusted by a variable resistor 26 and the offset is adjusted by a variable resistor 27. The subtractor 25 performs subtraction between the hold output M1 and the hold output $M_2$. As a result, the amount of deviation between the correct pattern length of the mark M, that is, latch data LTDT, and the actual pattern length of the mark M, that is, RF data RFDT can be detected. The amount of deviation is supplied to an adder 18.

The amount of deviation may be obtained such that a logical circuit previously generates leading edge phase difference pulse between the RF data RFDT and the latch data LTDT and the tailing edge phase difference pulse between the RF data RFDT and the latch data LTDT and subtraction is performed after the respective phase difference pulses have been converted into voltages.

On the other hand, the counter 14 is supplied with the latch data LTDT and the reproduction clock signal CLK through the inverter 11. The counter 14 counts the latch data LTDT in accordance with a timing signal supplied from the timing generator 13 so that output data DMODM shown in FIG. 18F is transmitted to the latch circuit 15.

In the latch circuit 15, the output data DMODM is latched in accordance with timing signal DMLTH generated at the tailing edge of the latch data LTDT transmitted from the timing generator 13 shown in FIG. 18E. Output data from the latch circuit 15 is supplied to an encoder 16.

In the encoder 16, code conversion is performed to correspond to the recorded pattern in accordance with the timing signal MLTH supplied from the timing generator 13 shown in FIG. 18G so that output data MOM shown in FIG. 18H is transmitted.

The output data MOM is supplied to a D/A (Digital/Analog) converter 17 so as to be converted into analog signal REFM which is then supplied to an adder 18. The analog signal REFM is reference voltage of the pattern length of the mark M.

In the adder 18, the gain is adjusted by a variable resistor 19 and the offset is adjusted by a variable resistor 20. The adder 18 adds the analog signal REFM and the amount of deviation from the subtractor 25. An output from the adder 18 is supplied to a sample hold circuit 32.

The timing generator 31 is supplied with 2-bit detection mode signal indicating the detection mode from a system controller through the signal input terminals 41 and 42. The detection mode signal indicates the mark and space detection mode when both of the levels of the 2-bit signals from the signal input terminal 41 and the signal input terminal 42 are high or low. When the level of the signal supplied from the signal input terminal 41 is high and that of the signal supplied from the signal input terminal 42 is low, the mark detection mode is indicated. When the level of the signal supplied from the signal input terminal 41 is low and the level of the of the signal supplied from the signal input terminal 42 is high, the space detection mode is indicated. As a result, the reset signal $MRST_3$ transmitted from the timing generator 31 to the sample hold circuit 32 is controlled so that the detection mode is switched.

Thus, the sample hold circuit 32 sample-holds the output from the adder 18 in response to the timing signal $MHLD_3$ and the reset signal $MRST_3$ in accordance with each detection mode. Specifically, in the case of the mark and space detection mode, the reset signal $MRST_3$ is not transmitted. In the case of the mark detection mode, the reset signal $MRST_3$ is used to perform resetting. As a result, the voltage corresponding to the pattern length including the amount of deviation of the mark M, that is, mark voltage MARK shown in FIG. 18T is transmitted.

Glitch noise generated when code conversion is performed in the D/A converter 17 and noise on the spike when sample holding is performed in the sample hold circuits 22, 29 and 32 can be restrained to a level that can be ignored by performing a signal process by using a low-pass filter (LPF) or the like.

A solid line of the mark voltage MARK shown in FIG. 18T indicates the voltage for use in the mark and space detection mode, while a doted line indicates the voltage for use in the mark detection mode.

Then, attention is paid to RF data indicated by one thick line among RF data RFDT shown in FIG. 18B. If the length of RF data indicated by the thick line is changed to three pattern lengths $V_1$, $V_2$ and $V_3$, voltage data $TVCNV_2$ is changed to three values to correspond to the pattern lengths $V_1$, $V_2$ and $V_3$. Also the timing $MHLD_2$ and the reset signal $MRST_2$ for use when the hold output $M_2$ is transmitted are generated at pulse positions corresponding to the three pattern lengths $V_1$, $V_2$ and $V_3$. Therefore, the voltage level of the hold output $M_2$ is raised or lowered to correspond to the three pattern lengths $V_1$, $V_2$ and $V_3$. As a result, also the mark voltage MARK corresponding to the pattern lengths $V_1$, $V_2$ and V3 can be obtained.

On the other hand, the space detection section 6 includes blocks corresponding to those shown in FIG. 17. Signals and data having symbols shown in FIG. 19 correspond to signals and data having symbols shown in FIG. 18. Similar to the signal process to be performed in the mark detection section 5, in the space detection section 6 shown in FIG. 17, RF data RFDT shown in FIG. 19B and reproduction clock signal shown in FIG. 19A are used to generate latch data LTDT shown in FIG. 19D so as to detect the amount of deviation of the space S and transmit space voltage SPACE shown in FIG. 19T. Although a reverse signal of the RF data RFDT supplied from the receiver 9 shown in FIG. 17 is supplied to the space detection section 6, the RF data shown in FIG. 19D indicates RF data which has not been reversed.

A sample hold circuit disposed in the space detection section 6 and corresponding to the sample hold circuit 32 in the mark detection section 5 does not transmit the reset signal $MRST_3$ if the mode is the mark and space detection mode. If the mode is the space detection mode, resetting is performed in response to the reset signal $SRST_3$.

A solid line indicating the space voltage SPACE shown in FIG. 19T indicate voltage for use in the mark and space detection mode, while a doted line indicates voltage in the space detection mode.

Similar to the description about the mark detection portion 5, attention is paid to RF data indicated by one thick line among the RF data RFDT. If RF data indicated by the thick line is changed to three pattern lengths $W_1$, $W_2$ and $W_3$ for example, voltage data $TVCNV_2$ shown in FIG. 19O is changed to three values to correspond to the pattern lengths $W_1$, $W_2$ and $W_3$. Also the voltage level of hold output S2 shown in FIG. 18Q is raised or lowered to correspond to the three pattern lengths $W_1$, $W_2$ and $W_3$. As a result, space voltage SPACE shown in FIG. 19T corresponding to the pattern lengths $W_1$, $W_2$ and $W_3$ can be also obtained.

In the mark detection section 5 and the space detection section 6, the reset signal $MRST_3$ or the reset signal $SRST_3$ is transmitted to the sample hold circuit 32 for performing the resetting operation. However, if the reset signal is transmitted to another circuit, for example, the D/A converter 17, for performing the resetting operation, mark voltage MARK or space voltage SPACE similar to the foregoing mark voltage MARK or the space voltage SPACE can be obtained.

When the pattern length including the leading edge is measured by the foregoing signal measurement apparatus and when the pattern length including the tailing edge is measured by the same, the common reproduction clock signal is used. Different reproduction clock signals may be used.

Then, the three detection modes will now be described.

In the mark and space detection mode, both of the mark voltage and the space voltage are plotted on the X axis and the Y axis. Therefore, the X axis and the Y axis stand for the mark M and the space S. In the mark detection mode, the X axis stands for the space S and Y axis stands for the mark M. In the space detection mode, the X axis stands for the mark M and the Y axis stands for the space S.

Here, relations between output of voltage and recorded pattern in each of the three detection modes are shown in FIG. 20.

Latch data LTDT shown in FIG. 20 is latch data which is the same as the latch data LTDT shown in FIGS. 18 and 19. Numerals indicating the length, a unit of which is the one period 1T of the reproduction clock signal CLK, is provided above the latch data LTDT. Moreover, whether the latch data LTDT is mark M or space S is indicated by symbol M or S. The sequential order of the latch data LTDT is indicated by patterns $P_1$ to $P_{10}$.

Figures 20A, 20B, 20C:
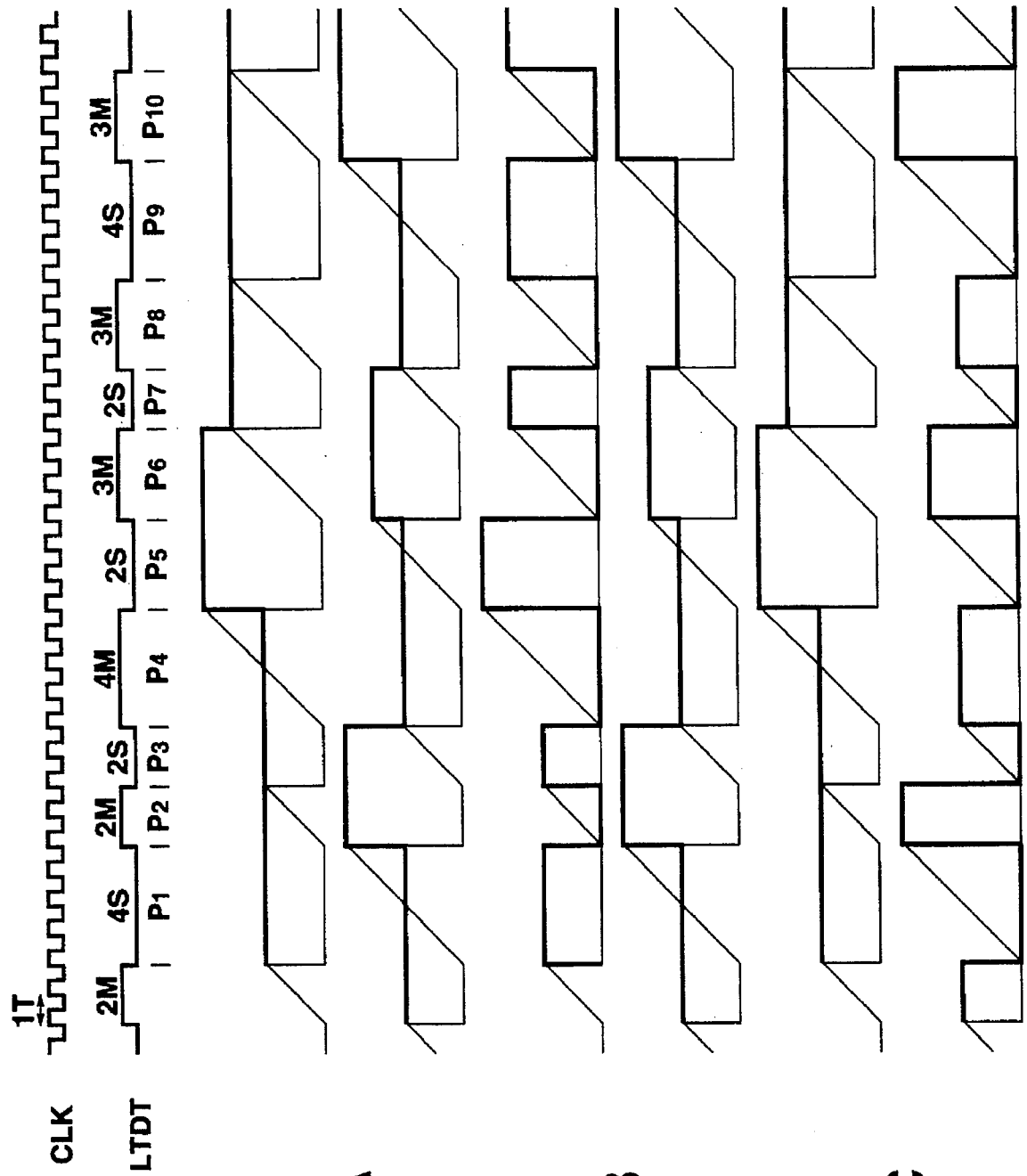
FIGS. 20A, 20B and 20C are graphs showing mark voltage and space voltage in each detection mode.

FIG. 20A shows the mark voltage MARK and the space voltage SPACE in the mark and space detection mode. FIG. 20B shows the mark voltage MARK and the space voltage SPACE in the mark detection mode. FIG. 20C shows the mark voltage MARK and the space voltage SPACE in the space detection mode. In each detection mode, a thin line schematically indicates the mark voltage MARK or the space voltage SPACE, while a thick line shows the sampling output of the mark voltage MARK or the space voltage SPACE.

The sampling output of the mark voltage MARK can basically be obtained by repetition of the following process: the voltage conversion is commenced at the leading edge of the latch data LTDT in the sample hold circuit 32 shown in FIG. 17, holding is performed at the tailing edge of the latch data LTDT, and then resetting is performed in response to the reset signal $MRST_3$, and then the voltage conversion is commenced at the leading edge of the next latch data LTDT.

The sampling output of the space voltage SPACE can basically be obtained by repetition of the following process: the voltage conversion is commenced at the trailing edge of the latch data LTDT in the sample hold circuit of the space detection section 6 corresponding to the sample hold circuit 32, holding is performed at the leading edge of the latch data LTDT, and then resetting is performed in response to the reset signal $SRST_3$, and then the voltage conversion is commenced at the trailing edge of the next latch data LTDT.

Figure 21A:
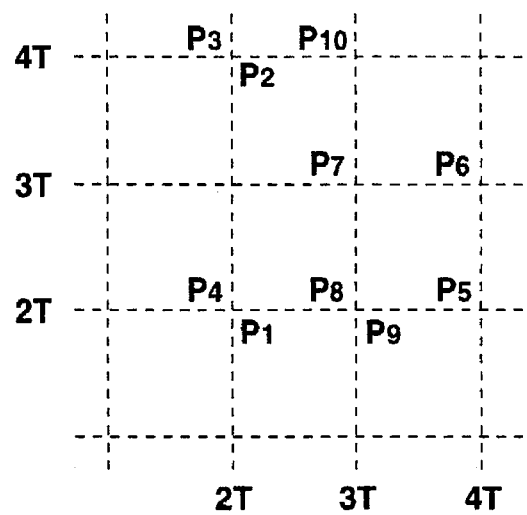
FIGS. 21A, 21B and 21C are diagrams showing 2D-mapping in each detection mode.

Specifically, in the mark and space detection mode, the reset signal $MRST_3$ and the reset signal $SRST_3$ are not supplied, as shown in FIG. 20A, so that the voltage is held until latch data LTDT of a next mark M or space S is supplied. When voltage of pattern $P_2$, which is the mark M, is transmitted, mark voltage 2M of the pattern prior to pattern P1 and space voltage 4S of pattern $P_1$ are held. When voltage of pattern $P_3$, which is the space S, is transmitted, space voltage 4S of the pattern $P_1$ and mark voltage 2M of the pattern $P_2$ are held. FIG. 21A is a plot diagram showing the thus-obtained mark voltage MARK and the space voltage SPACE plotted on the XY axes so as to be 2D-displayed indicates both of the relationship between the previous mark M and the space M following the mark M and the relationship between the previous space S and the mark M following the space S.

Figure 21B:
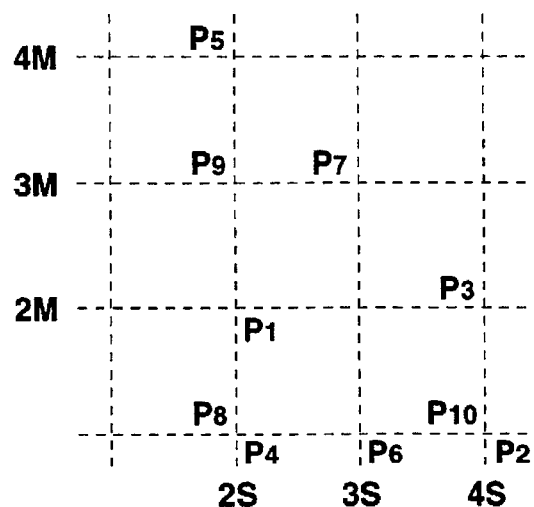

In the mark detection mode, the mark voltage MARK is reset and output of the same is inhibited during detection of the mark voltage MARK. Therefore, the mark voltage MARK is plotted in the lower outside of the range shown in FIG. 21B when mark voltages MARK of patterns $P_2$, $P_4$, $P_6$, $P_8$ and $P_{10}$ are transmitted. That is, in the mark detection mode, the relationship between the space S and the mark M following the space S is shown in FIG. 21B.

Figure 21C:
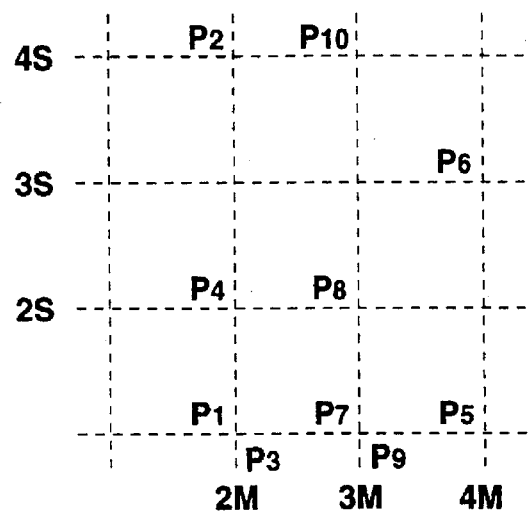

In the space detection mode, the space voltage SPACE is not transmitted during detection of the space voltage SPACE. Therefore, the space voltage SPACE is plotted in the lower outside of the range shown in FIG. 21C when space voltage SPACE of patterns $P_1$, $P_3$, $P_5$, $P_7$ and $P_9$ are transmitted. That is, in the space detection mode, the relationship between the mark M and the space S following the mark M is shown in FIG. 21C.

Although the description of the foregoing embodiments has been performed such that the signal recorded portion "High", that is, signal portion "1" is the mark M and non-signal portion "LOW", that is, signal portion "0" is the space S, the mark M and space S indicate the relationship between logic signals to be transmitted alternately. Therefore, they may be defined contrary.

Although each of the signal measurement apparatuses respectively according to the third and fourth embodiments has the structure such that the pattern lengths of two marks M recorded successively are measured to evaluate the recorded pattern of a digital signal, the pattern lengths of two arbitrary marks M, which are not successively recorded, may be measured to evaluate the digital-recorded pattern.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A signal measurement method comprising the steps of:

detecting a first pattern length which corresponds to an interval between first edges of digital binary-coded data;

detecting a second pattern length which corresponds to an interval between second edges; and performing 2D display such that the first pattern length is made to be input to the X axis and the second pattern length is made to be input to the Y axis.

2. A signal measurement method according to claim 1, wherein said first pattern length and said second pattern length include the phase of either of a leading edge or a tailing edge.

3. A signal measurement method according to claim 2, wherein a reproduction clock signal is generated using the binary-coded data and the phase of the edge is detected by comparing the phase of the binary-coded data and the phase of data obtained by latching the binary-coded data in response to the reproduction clock signal with each other while using, as a reference phase, the phase of the reproduction clock signal.

4. A signal measurement method according to claim 1, wherein the first pattern length is a pattern length corresponding to the length of data corresponding to a non-signal portion of the binary-coded data and the second pattern length is a pattern length corresponding to the length of data corresponding to a signal recorded portion following the non-signal portion.

5. A signal measurement method according to claim 1, wherein the first pattern length is a pattern length corresponding to the length of data corresponding to a signal recorded portion of the binary-coded data and the second pattern length is a pattern length corresponding to the length of data corresponding to a non-signal portion following the signal recorded portion.

6. A signal measurement method according to claim 1, wherein the first pattern length is a pattern length corresponding to the length of data corresponding to a forward signal recorded portion and the second pattern length is a pattern length corresponding to the length of data corresponding to a signal recorded portion following the forward signal recorded portion.

7. A signal measurement apparatus comprising:

first-pattern-length detection means for detecting a first pattern length which corresponds to an interval between first edges of digital binary-coded data;

second-pattern-length detection means for detecting a second pattern length which corresponds to an interval between second edges; and 2D display means for performing 2D display such that the first pattern length is made to be input to the X axis and the second pattern length is made to be input to the Y axis.

8. A signal measurement apparatus according to claim 7, wherein said first pattern length and said second pattern length include the phase of either of a leading edge or a tailing edge.

9. A signal measurement apparatus according to claim 8, wherein a reproduction dock signal is generated using the binary-coded data and the phase of the edge is detected by comparing the phase of the binary-coded data and the phase of data obtained by latching the binary-coded data in response to the reproduction clock signal with each other while using, as a reference phase, the phase of the reproduction clock signal.

10. A signal measurement apparatus according to claim 7, wherein the first pattern length is a pattern length corresponding to the length of data corresponding to a non-signal portion of the binary-coded data and the second pattern length is a pattern length corresponding to the length of data corresponding to a signal recorded portion following the non-signal portion.

11. A signal measurement apparatus according to claim 7, wherein the first pattern length is a pattern length corresponding to the length of data corresponding to a signal recorded portion of the binary-coded data and the second pattern length is a pattern length corresponding to the length of data corresponding to a non-signal portion following the signal recorded portion.

12. A signal measurement apparatus according to claim 7, wherein the first pattern length is a pattern length corresponding to the length of data corresponding to a forward signal recorded portion and the second pattern length is a pattern length corresponding to the length of data corresponding to a signal recorded portion following the forward signal recorded portion.

* * * * *